(12) United States Patent  
Van De Peut et al.

(10) Patent No.: US 8,710,465 B2  
(45) Date of Patent: Apr. 29, 2014

(54) PATTERN DATA CONVERSION FOR LITHOGRAPHY SYSTEM

(75) Inventors: Teunis Van De Peut, Leusden (NL); Marco Jan-Jaco Weiland, Delft (NL)

(73) Assignee: Mapper Lithography IP B.V., Delft (NL)

( * ) Notice: Subject to any disclaimer, the term of this patent is extended or adjusted under 35 U.S.C. 154(b) by 0 days.

(21) Appl. No.: 13/293,426

(22) Filed: Nov. 10, 2011

(65) Prior Publication Data

US 2012/0286173 A1   Nov. 15, 2012

Related U.S. Application Data

(63) Continuation of application No. PCT/IB2010/052180, filed on May 17, 2010.

(60) Provisional application No. 61/179,765, filed on May 20, 2009, provisional application No. 61/179,760, filed on May 20, 2009, provisional application No. 61/257,122, filed on Nov. 2, 2009.

(51) Int. Cl.
*H01J 37/06* (2006.01)
*H01J 37/07* (2006.01)
*G21K 5/10* (2006.01)

(52) U.S. Cl.
USPC ............ 250/492.22; 250/492.2; 250/492.3; 430/5; 430/296; 430/396

(58) Field of Classification Search
USPC ........ 250/398, 491.1, 492.1, 492.21, 492.22, 250/492.3; 430/5, 22, 30, 296, 396
See application file for complete search history.

(56) References Cited

U.S. PATENT DOCUMENTS

| | | | |
|---|---|---|---|
| 5,363,213 A * | 11/1994 | Coward et al. ................ 382/299 |
| 6,768,125 B2 * | 7/2004 | Platzgummer et al. .. 250/492.22 |
| 6,897,458 B2 | 5/2005 | Wieland et al. |
| 6,958,804 B2 | 10/2005 | Wieland et al. |
| 7,019,908 B2 | 3/2006 | van t Spijker |
| 7,064,869 B2 * | 6/2006 | Spaulding et al. ............. 358/3.1 |
| 7,075,093 B2 * | 7/2006 | Gorski et al. ............. 250/492.2 |
| 7,084,414 B2 | 8/2006 | Wieland et al. |
| 7,129,502 B2 | 10/2006 | Kruit |
| 7,294,440 B2 * | 11/2007 | Rankin et al. ................... 430/30 |
| 7,573,561 B2 * | 8/2009 | Fries ............................... 355/67 |
| 8,018,623 B2 * | 9/2011 | Couwenhoven et al. ..... 358/3.06 |
| 8,089,056 B2 | 1/2012 | Wieland |
| 8,198,602 B2 | 6/2012 | Koning |
| 2003/0122091 A1 * | 7/2003 | Almogy ................... 250/492.24 |
| 2003/0155534 A1 * | 8/2003 | Platzgummer et al. .. 250/492.22 |

(Continued)

FOREIGN PATENT DOCUMENTS

WO   WO2010134026 A1   11/2010

*Primary Examiner* — Bernard E Souw
(74) *Attorney, Agent, or Firm* — Hoyng Monegier LLP; David P. Owen; Coraline J. Haitjema

(57) ABSTRACT

A method and system for exposing a target according to pattern data in a maskless lithography machine generating a plurality of exposure beamlets for exposing the target. The method comprises providing input pattern data in a vector format, rendering and quantizing the input pattern data to generate intermediate pattern data, and re-sampling and re-quantizing the intermediate pattern data to generate output pattern data. The output pattern data is supplied to the lithography machine, and the beamlets generated by the lithography machine are modulated on the basis of the output pattern data.

62 Claims, 15 Drawing Sheets

(56) References Cited

U.S. PATENT DOCUMENTS

| | | | |
|---|---|---|---|
| 2003/0218780 A1* | 11/2003 | Braun et al. | 358/3.12 |
| 2005/0253093 A1* | 11/2005 | Gorski et al. | 250/492.22 |
| 2006/0019412 A1* | 1/2006 | Rankin et al. | 438/4 |
| 2006/0269116 A1 | 11/2006 | Makarovic et al. | |
| 2006/0291720 A1* | 12/2006 | Malvar et al. | 382/166 |
| 2007/0064213 A1 | 3/2007 | Jager et al. | |
| 2009/0261267 A1 | 10/2009 | Wieland | |
| 2011/0073782 A1 | 3/2011 | Wieland | |
| 2011/0079730 A1 | 4/2011 | Wieland | |
| 2012/0091358 A1 | 4/2012 | Wieland et al. | |
| 2012/0287410 A1* | 11/2012 | Wieland et al. | 355/18 |

* cited by examiner

PATTERN DATA CONVERSION FOR LITHOGRAPHY SYSTEM

CROSS REFERENCE TO RELATED APPLICATIONS

This application is a continuation of PCT application number PCT/IB2010/052180 filed on 17 May 2010, which claims priority from U.S. provisional application No. 61/179,765 filed on 20 May 2009, U.S. Provisional application 61/179,760 filed on 20 May 2009 and U.S. provisional application 61/257,122 filed on 2 Nov. 2009. All applications are hereby incorporated by reference in their entireties.

BACKGROUND OF THE INVENTION

1. Field of the Invention

The present invention relates to a maskless lithography apparatus, and in particular to a system and method for converting vector format pattern data for use by a lithography apparatus.

2. Description of the Related Art

A maskless lithography machine generates optical or particle beamlets for exposing a target. The machine requires pattern data for modulating the beamlets as they are scanned over the surface of the target. When exposing a target at very high resolution, a very large amount of pattern data is required to enable the scanning process.

The pattern data is usually initially generated in a vector format, such as a GDS-II or OASIS format, and is then usually converted into a bitmap format for modulating the beamlets. In the conversion from the vector format to a bitmap, it is advantageous to store the data in an intermediate data format to permit some processing to be performed in advance of exposing the wafer while not requiring a large storage capacity to store the voluminous fully converted pattern data. A vector format may be used as the intermediate vector format. A vector format permits complex manipulations to be performed on the pattern data, such as performing various types of corrections which may involve pattern shifting or scaling in two dimensions and involving multiple pixel or sub-pixel shifts.

However, a vector format has the disadvantage it is non-deterministic, so the amount of memory required to store the data is a function of the pattern data, and the actual memory requirement to store the pattern data cannot be determined in advance. This is a significant drawback in view of the very large size of the pattern data.

BRIEF SUMMARY OF THE INVENTION

The invention includes a method for exposing a target according to pattern data in a maskless lithography machine generating a plurality of exposure beamlets for exposing the target. The method comprises providing input pattern data in a vector format, rendering and quantizing the input pattern data to generate intermediate pattern data, and re-sampling and re-quantizing the intermediate pattern data to generate output pattern data. The output pattern data is supplied to the lithography machine, and the beamlets generated by the lithography machine are modulated on the basis of the output pattern data. The vector format input pattern data is converted into output pattern data in the form of a spatially mapped array of pixel values. The output pattern data may comprise bi-level pattern data, and may comprise B/W bitmap data. The intermediate pattern data may comprise multi-level bitmap data. The intermediate pattern data representing a certain portion of a pattern preferably comprises a greater amount of data than the output pattern data representing the same portion of the pattern.

The method may include various preprocessing steps. The method may include preprocessing vector pattern data to generate the input pattern data, where the preprocessing comprises a proximity effect correction and/or a resist heating correction.

Rendering the vector pattern data may comprise defining an array of pixel cells, and assigning values to the pixel cells based on relative coverage of the pixel cells by features defined by the input pattern data. The quantizing may comprise dithering by application of error diffusion on the rendered input pattern data, and the error diffusion may comprise distributing quantization error in a pixel of the rendered input pattern data to one or more adjacent pixels of the intermediate pattern data. The input pattern data may further comprise dose map data, the intermediate pattern data being formed on the basis of the vector format input pattern data and the dose map data.

The re-sampling may comprise defining an output grid which defines an array of output pixel cells, and assigning a value to each output pixel cell based on intermediate pattern data values falling within the output pixel cell and fractions of the output pixel cell occupied by those intermediate values. The values in the output pixel cells may be determined by calculating an average intermediate pattern data value falling within the output pixel cells.

The re-sampling may optionally comprise transforming a pixel size of the intermediate pattern data, and the pixel size of the intermediate pattern may be larger or smaller than a pixel size of the output pattern data. Transforming the pixel size, so that the pixel size of the output pattern data is different from the pixel size of the intermediate pattern data, permits making adaptations which improve performance.

Although a double quantization reduces performance in comparison to a single quantization in terms of lithographic errors (e.g. critical dimension uniformity and overlay), the performance reduction may be decreased by using more data to store the pattern after the first quantization than the amount of data that remains after the second quantization. For example, intermediate pattern data which has a pixel size of 5 nm with 4-bit grey level pixel values after the first quantization (or pixel size of 2.5 nm with 1-bit B/W pixel values) contains more data than output patter data with a pixel size of 3.5 nm with 1-bit bi-level B/W pixel values. Ideally the intermediate pattern data has a very high resolution after the first quantization step, but this requirement is balanced against the cost and complexity of storing such a large amount of data. The change in pixel size during re-sampling enables this adjustment of data resolution from intermediate to output pattern data.

Changing the pixel size also enables changing the exposure dose without changing the transmission rate of the output pattern data to the column of the lithography machine which cannot be easily changed. By changing the scanning speed of the beamlets and the pixel size of the output pattern data the dose rate may be changed (the pixel size of the output pattern data can also become rectangular due to this).

Various corrections may be performed in conjunction with the re-sampling step and the re-quantizing step. Re-sampling allows for shift, scaling, and distortion corrections. The corrections may be implemented by shifting, scaling, rotating, and/or distorting the output grid defined for the re-sampling. A dose correction may also be implemented in the re-quantizing step.

A pattern shift may be performed on the intermediate pattern data, the pattern shift comprising a shift in the output grid. The pattern shift may be used for correcting beamlet misalignment. A pattern shift may be performed on the intermediate pattern data comprising a shift of the pattern data in both a mechanical scan direction of the lithography machine and a direction perpendicular to the mechanical scan direction. The pattern shift may comprise a shift of pattern data for an entire stripe of the pattern data.

A pattern scaling adjustment may also be performed on the intermediate pattern data, the pattern scaling comprising scaling the output grid. The pattern scaling adjustment may be used for correcting for variations in beamlet scan deflection. A pattern scaling adjustment may be performed on the intermediate pattern data comprising a scaling of pattern data for an entire stripe of the pattern data.

A dose correction may also be performed on the intermediate pattern data. The dose correction may be performed per beamlet, and may be determined based on a dose factor per beamlet and a scaling factor for a stripe of the pattern data.

A correction may also be performed on the intermediate pattern data for compensating for variation in the position of one or more of the beamlets. The correction may comprise an adjustment of the input pattern data that results a shift of the intermediate pattern data having a component in both the mechanical scan direction and a direction substantially perpendicular to the mechanical scan direction. A correction may also be performed on the intermediate pattern data for compensating for variation in the transmission time of the output pattern data to the lithography machine. A field distortion adjustment may also be performed on the intermediate pattern data, the distortion adjustment comprising distorting the output grid. The distortion may be used for improving overlay performance, and/or for improving matching with a different lithography tool. The distortion may comprise at least one of a field size adjustment, a field position adjustment, a rotation of the field, an asymmetrical field size adjustment, and/or an asymmetrical rotation, and may additionally comprise higher order distortions.

The re-quantizing step may comprise dithering, by application of error diffusion on the re-sampled intermediate pattern data. The first quantizing step may comprise a dithering process and the second (re-)quantizing step may comprise a re-dithering process, and the dithering and re-dithering are preferably performed in opposite directions (e.g. dithering from left-to-right and top-to-bottom and re-dithering from right-to-left and bottom-to-top).

The input pattern data may be dithered twice to generate two sets of intermediate pattern data, each set being dithered in opposite directions. The two sets of intermediate pattern data may be used for exposing alternating exposure lanes of the target, each set of intermediate pattern data being re-dithered in the opposite direction to the dithering before use. The target may be moved so that each exposure lane of the target is exposed in a same direction.

The re-dithering error diffusion comprises distributing quantization error in a pixel of the re-sampled pattern data to one or more adjacent pixels of the output pattern data. The error diffusion may include defining an array of pixels, dividing the array of pixels into portions, each portion being assigned to be exposed by a different beamlet, determining error diffusion parameter values for each portion, and assigning a value to the pixels within each portion using error diffusion parameter values. The error diffusion parameter values may comprise a threshold value and a weight value for the higher level of a bi-level output pattern data value, and may further comprise a weight value for the lower level of the bi-level value. The error diffusion parameter value may be a threshold value, wherein assigning a bi-level value to the pixel cells within a portion is based on comparison with the threshold value determined for the portion.

The error diffusion may be restricted by disallowing diffusion towards one or more pixels with a multi-level value equal to or below a further threshold value, and/or by disallowing diffusion to one or more pixels that are located outside the features described in the input pattern data, and/or by disallowing diffusion towards one or more pixels that have a value that differ more than a certain amount from the pixel being processed.

Each pixel may have a label and the error diffusion may be restricted by disallowing diffusion towards one or more pixels that have a different label than the pixel being processed. The label may comprise a code stored with the intermediate pattern data. The label may be defined during preprocessing, and all pixels covered by a feature in the vector format input pattern data may be assigned a first label value and all other pixels assigned a second label value.

According to the method of the invention, the rendering and quantizing may be done in advance of exposing the wafer, and the intermediate pattern data produced by these steps is in the form of a spatially mapped array of pixel values which has deterministic size so that the necessary storage capacity to store the intermediate pattern data can be determined in advance. Furthermore, by means of the re-sampling and re-quantizing steps, corrections may be performed on the intermediate pattern in real-time. Thus, a pattern data format having a deterministic size may be used while retaining the ability to perform real-time corrections on the pattern data.

The invention also relates to a method of operating a lithography machine wherein image data is supplied in vector format to the machine in a first step, the vector format is rendered and quantized to a bitmap data format in a second step, the bitmap data is re-sampled in a third step for performing real-time corrections on the data, the re-sampled data is re-quantized in a fourth step, and subsequently supplied as an output bitmap to imaging hardware of the machine in a fifth step. The amount of data utilized for performing the first quantization step is preferably larger than the amount of data resulting from performing said re-sampling. The re-sampling may comprise one or more of a pattern shift, pattern scaling, or field distortion correction, and the re-quantizing may comprise performing a dose correction. A dithering process may be performed in conjunction with the quantizing step, including a dose correction performed by adapting a dithering threshold value. The method may also include controlling exposure dose by modifying a pixel size of the output bitmap by transforming a pixel size of the intermediate pattern data in conjunction with said re-sampling.

In another aspect the invention also relates to a data path for converting input pattern data in a vector format to output pattern data in the form of a spatially mapped array of pixel values. The data path comprises a first processing unit for rendering and quantizing the input pattern data to generate intermediate pattern data, a first storage unit for storing the intermediate pattern data, and a second processing unit for re-sampling and re-quantizing the intermediate pattern data to generate output pattern data. The first processing unit may also comprise software and/or hardware for dithering the rendered input pattern data, and the second processing unit may comprise software and/or hardware for re-dithering the re-sampled pattern data. The capacity of the first storage unit is preferably sufficient to store the intermediate pattern data for an entire field of the pattern data. The data path may also comprise a second storage unit for storing the output pattern data.

In a further aspect, the invention includes a system for exposing a target according to pattern data, the comprising a maskless lithography machine generating a plurality of exposure beamlets for exposing the target and modulating the beamlets on the basis of output pattern data, a data path for receiving input pattern data and generating the output pattern data, and a pattern streaming system for supplying the output pattern data to the lithography machine.

BRIEF DESCRIPTION OF THE DRAWINGS

Various aspects of the invention and certain examples of embodiments of the invention are illustrated in the drawings in which.

DESCRIPTION OF ILLUSTRATIVE EMBODIMENTS

The following is a description of various embodiments of the invention, given by way of example only and with reference to the drawings.

Charged Particle Lithography System

Figure 1:
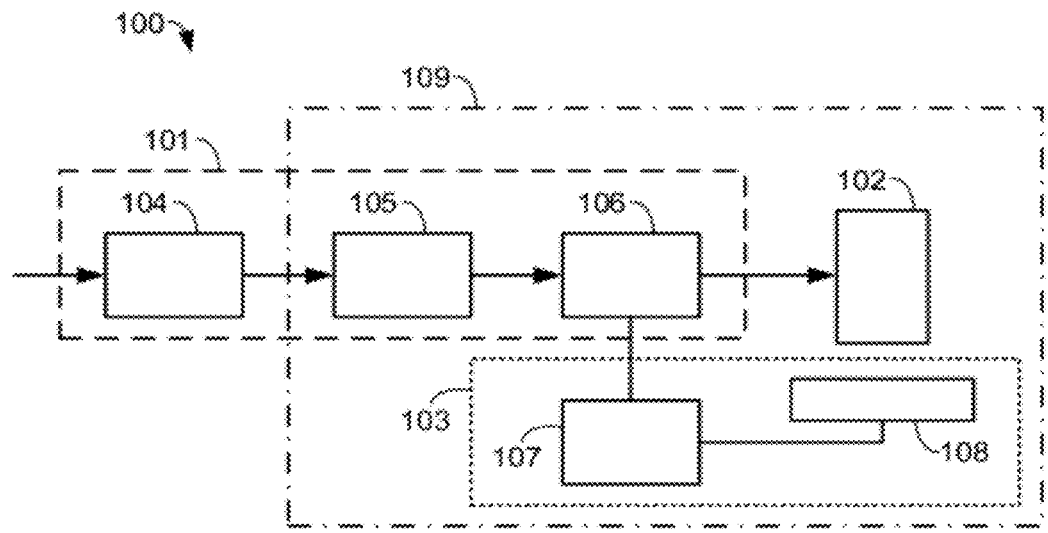
FIG. 1 is a conceptual diagram showing a maskless lithography system.

FIG. 1 is a conceptual diagram showing a maskless lithography system 100 divided into three high level sub-systems: a data path 101, a lithography machine column 102, and wafer positioning system 103. The lithography machine column 102 generates optical or charged particle beams for exposing a wafer according a pattern data provided by the data path. The wafer positioning system 103 moves the wafer under the column 102 to enable scanning of the wafer by the exposure beams generated by the column 102.

The wafer positioning system 103 typically includes a control system 107 controlling movement of a wafer table 108 on which the wafer is placed. In one embodiment, the wafer positioning system moves the wafer in an x-direction while the beams are scanned across the surface of the wafer in a y-direction. The wafer positioning system is provided with synchronization signals from the data path 101 to synchronize the positioning of the wafer under the exposure beams with the pattern data transmitted to the column by the data path.

The column 102 generates optical or charged particle beams for exposing the wafer. The beams are scanned across the surface of the wafer and modulated in synchronization with the scanning according to pattern data provided by the data path in bitmap format. The modulation of the beams may be performed by switching individual beams or groups of beams on and off, or by modulating their intensity, resulting in an exposure pattern on the surface of the wafer which corresponds to the pattern data.

The data path 101 typically includes an off-line processing system 104, an "in-line" processing system 105, and a pattern streaming system 106. The off-line processing system 104 receives pattern data representing features to be reproduced on the wafer, usually for making one layer of a semiconductor integrated circuit. The pattern data is usually in generated in vector format, and the off-line processing system performs various preprocessing operations on the data. The preprocessed pattern data is then uploaded to the lithography tool 109 for storage and further processing by the "in-line" processing system 105. When exposure of a wafer is to take place, the processed pattern data is transferred to the pattern streaming system 106 for streaming to the column 102.

The components are typically arranged as two separate groups of equipment, an off-line processing system 104 and a lithography machine 109, also referred to as a lithography tool. The lithography tool typically includes the wafer positioning system 103, lithography machine column 102, in-line processing system 105, and pattern streaming system 106.

Figure 2:
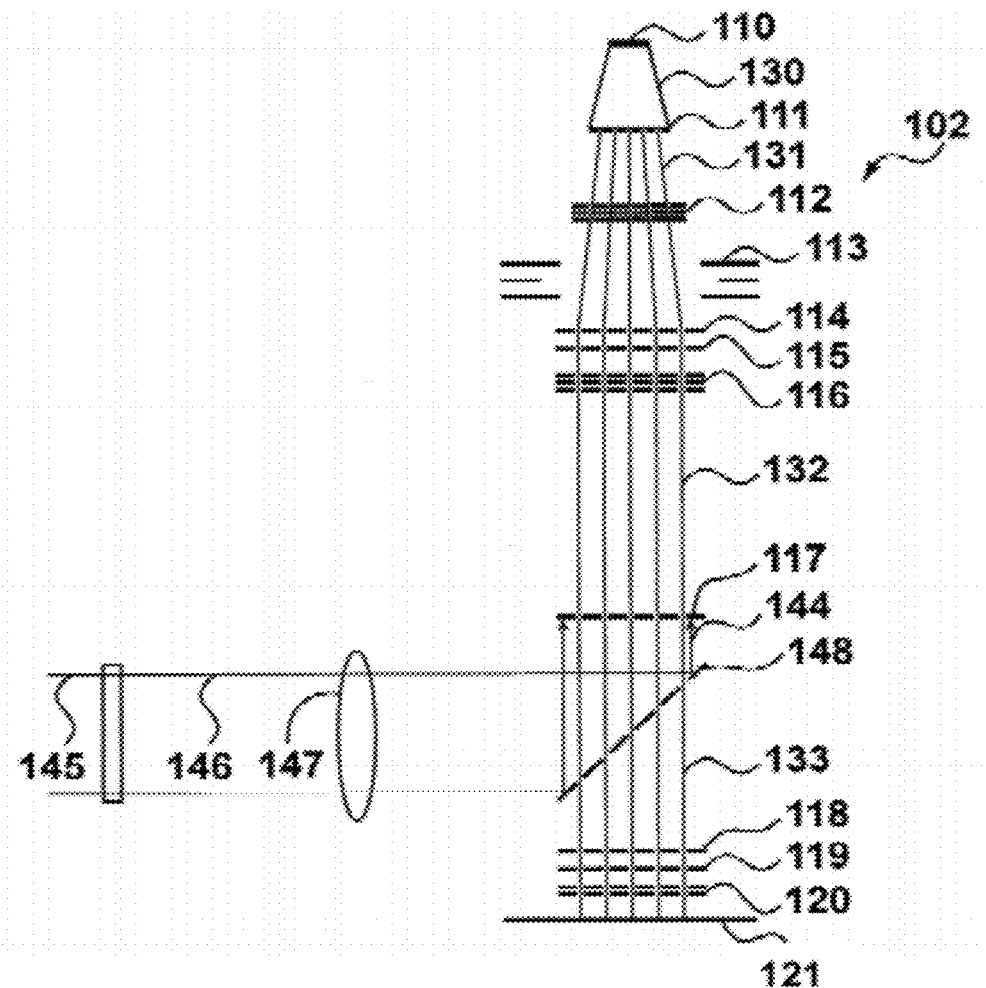
FIG. 2 is a simplified schematic drawing of an embodiment of a charged particle lithography system 100 showing details of the electron optical column.

FIG. 2 is a simplified schematic drawing of an embodiment of a charged particle lithography system 100 showing details of the electron optical column 102. Such lithography systems are described for example in U.S. Pat. Nos. 6,897,458 and 6,958,804 and 7,019,908 and 7,084,414 and 7,129,502, U.S. patent application publication no. 2007/0064213, and co-pending U.S. patent application Ser. Nos. 61/031,573 and 61/031,594 and 61/045,243 and 61/055,839 and 61/058,596 and 61/101,682, which are all assigned to the owner of the present application and are all hereby incorporated by reference in their entirety.

In the embodiment shown in FIG. 2, the lithography system comprises a charged particle source 110, e.g. an electron source for producing an expanding electron beam 130. The expanding electron beam 130 impinges on an aperture array 111, which blocks part of the beam to create a plurality of beamlets 131. The system generates a large number of beamlets, preferably in the range of about 10,000 to 1,000,000 beamlets.

The electron beamlets 131 pass through a condenser lens array 112 which focuses the electron beamlets 131. The beamlets 131 are collimated by collimator lens system 113. The collimated electron beamlets pass through XY deflector array 114, a second aperture array 115, and second condenser lens array 116. The resulting beamlets 132 next pass through beam blanker array 117, comprising a plurality of blankers for deflecting one or more of the beamlets. The beamlets pass through mirror 143 and arrive at beam stop array 118, which has a plurality of apertures. The beamlet blanker array 117 and beam stop array 118 operate together to switch the beamlets on or off, by either blocking beamlets or letting them pass. The beamlet blanker array 117 can deflect a beamlet so that it will not pass through the corresponding aperture in beam stop array 118, but instead will be blocked. If beamlet blanker array 117 does not deflect a beamlet, then it will pass through the corresponding aperture in beam stop array 118. The undeflected beamlets pass through the beam stop array, and through a beam deflector array 119 and projection lens arrays 120.

Beam deflector array 119 provides for deflection of each beamlet 133 in the X and/or Y direction, substantially perpendicular to the direction of the undeflected beamlets, to scan the beamlets across the surface of target 121. This deflection is separate from the deflection used by the beamlet blanker array to switch the beamlets on or off. Next, the beamlets 133 pass through projection lens arrays 120 and are projected onto target 121. The projection lens arrangement preferably provides a demagnification of about 100 to 500 times. The beamlets 133 impinge on the surface of target 121 positioned on a moveable stage of the wafer positioning system 101. For lithography applications, the target usually comprises a wafer provided with a charged-particle sensitive layer or resist layer.

The representation shown in FIG. 2 is much simplified. In a preferred embodiment, a single electron beam is first partitioned into many smaller subbeams which are then split into an even larger number of beamlets. Such a system is described in U.S. patent application 61/045,243, which is hereby incorporated by reference in its entirety.

In this system each subbeam is split into a number of beamlets which can be considered a patterned beam. In one embodiment, each subbeam is split into 49 beamlets arranged in a 7×7 array. The beamlet blanker array preferably comprises one hole with an associated blanker electrode for each beamlet, to enable on/off switching of each individual beamlet. The arrangement of beamlets in a patterned beam and writing strategies are described for example in U.S. patent application 61/058,596, which is hereby incorporated by reference in its entirety. The beam deflector array and projection lens array preferably include only one hole and lens for each patterned beam (e.g. one hole or lens for each group of 49 beamlets making up one patterned beam). Beamlets are typically combined (interleaved/multiplexed) in a group that writes a singe stripe.

Data Path Architecture

Figure 3:
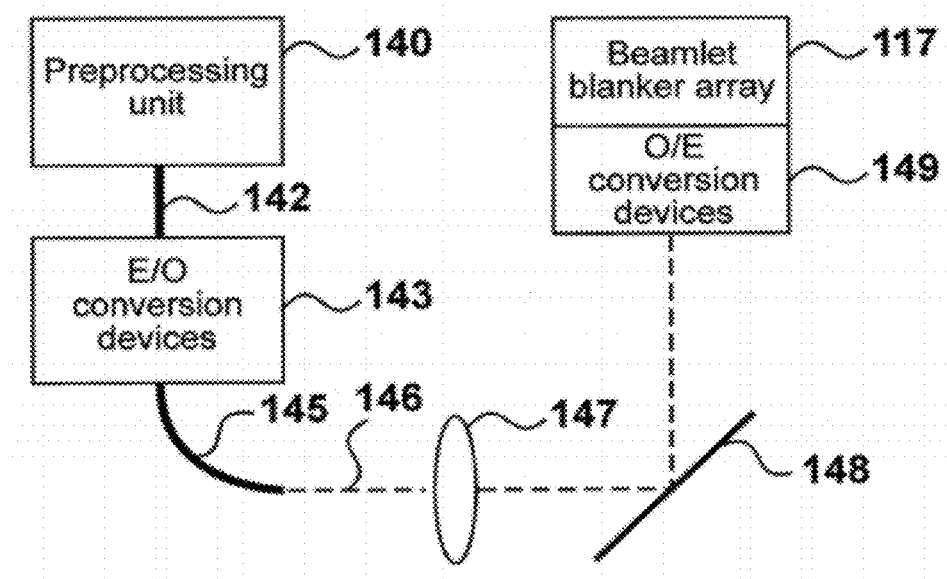
FIG. 3 is a simplified block diagram of an embodiment of a data path.

A simplified block diagram of one embodiment of a data path 101 is shown in FIG. 3, and a portion of the data path also appears in FIG. 2. The switching of beamlet blanker array 117 is controlled via the data path. A processing unit 140 receives information describing the layout of the device to be manufactured by the lithography machine, typically provided in a vector file format. The processing unit (which may include an off-line processing system 104, an in-line processing system 105, and a pattern streaming system 106) performs a series of transformations of this information to generate control signals to control the beamlet blanker array 117.

The control signals are transmitted via 142 to electro-optical conversion devices 143, such as laser diodes, to convert the electrical control signals into optical signals. The optical control signals are guided through optical fibers 145. Free space light beams 146 at the output of the fibers are guided through an array of lenses 147 onto a holey mirror 148. From the mirror, the light beams are reflected onto the underside of beam blanker array 117. The individual light beams are directed onto a plurality of optical-to-electrical conversion devices 149, such as photo diodes, on the underside of the beam blanker array 117. Preferably, for every optical fiber 145 there is a photo diode on the beamlet blanker array. The photo diodes operate to activate the individual beam blanker electrodes to modulate or control the deflection of beamlets 132 to switch the individual beamlets on or off.

The control signals for controlling the individual beamlet blanker electrodes are preferably multiplexed, so that each light beam 146 carries control signals for a channel comprising a number of beamlets that share one optical fiber and photo diode. The multiplexed light beams are received by photo diodes and converted into an electrical signal. The beamlet blanker array 117 includes logic for demultiplexing the control signals received by the photo diodes to derive control signals for individually controlling a number of beamlet blanker electrodes. In a preferred embodiment, individual control signals for controlling 49 beamlets of one patterned beam, are time multiplexed for transmission over a single optical fiber, and are received by a single photo diode on the beamlet blanker array.

In addition to multiplexing, the beamlet control signals may also be arranged in frames for transmission and may have synchronisation bits and additional encoding to improve transmission, e.g. using an encoding technique to achieve frequent signal transitions, to prevent using the laser diodes and photo diodes in a DC-coupled fashion. By forcing transitions, the clock signal is automatically distributed in the optical signal.

Closer to the wafer the beam deflector array 119 is used to deflect the electron beamlets in the y-direction (and also a small deflection in the x-direction) to achieve scanning of the electron beamlets over the surface of the wafer 121. In the described embodiment, the wafer 121 is mechanically moved in the x-direction by the wafer positioning system 101, and the electron beamlets are scanned across the wafer in a y-direction substantially perpendicular to the x-direction. When writing data, the beamlets are deflected slowly (compared to the fly-back time) in the y-direction. At the end of a sweep, the beamlets are moved quickly back to the start position of the y-range (this is referred to as the fly-back). The beam deflector array 119 receives timing and synchronization information from the data path 103.

Channels

Figure 4:
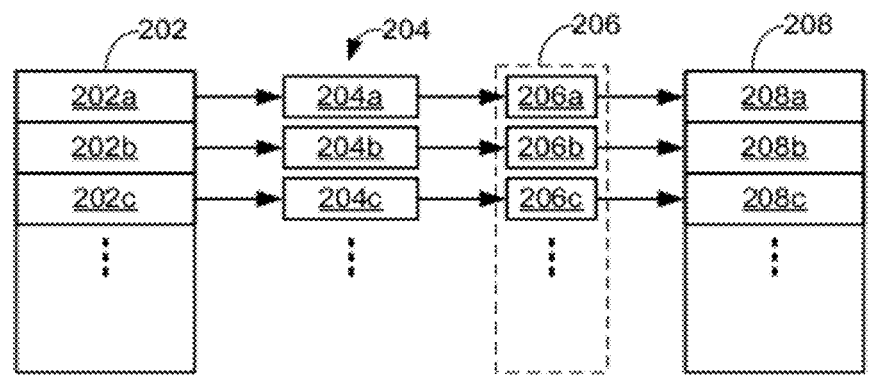
FIG. 4 is a conceptual diagram of a lithography system comprising multiple channels.

The data path may be divided into a number of channels. A channel is a data path from the preprocessing unit to the lithography system (and may be considered to extend to the target). FIG. 4 shows a conceptual diagram of an example of a system comprising multiple channels. A pattern data file 202 is divided into portions 202a, 202b, 202c etc. which relate to portions of the pattern to be exposed on the target. In one embodiment, each portion includes pattern data for a stripe of a field to be exposed on a wafer. The pattern data 202 is transmitted via processing and communication channels 204, which in this example comprise separate channels 204a, 204b, 204c etc. for transmitting pattern data for each portion of the pattern data. In one embodiment a channel comprises an electrical-to-optical converter (e.g. a laser diode), an optical fiber for transmitting beamlet control signals, and an optical-to-electrical converter (e.g. a photo diode). The communication channels 204 transmit the pattern data to the beamlet blanker array 206 of the lithography machine. In one embodiment, the beamlet blanker array includes groups of blanker elements 206a, 206b, 206c etc. each for modulating a group of beamlets according to pattern data transmitted by a single channel. The beamlet blanker array 206 modulates beamlets according to the pattern data to expose a field 208 on the target. In one embodiment, the beamlets modulated by each group of blanker elements 206a, 206b, 206c etc. expose a corresponding stripe 208a, 208b, 208c etc. of the field on the target.

A channel may be assigned to transmit the control signals for a single patterned beam comprising a number of individual beamlets (e.g. 49 beamlets making up one patterned electron beam). One patterned beam may be used for writing a single stripe on the wafer. In this arrangement, a channel represents the data path components dedicated to control of one patterned beam comprising multiple beamlets (e.g. 49 beamlets) and carrying the beamlet control signals for writing one stripe according to the pattern data. A subchannel represents the data path components dedicated to control of a single beamlet within a patterned beam.

Data Path Processing

The data path 101 transforms the vector pattern data into output pattern data for controlling the beamlets of the lithography machine. The output pattern data is in bitmap format, herein defined as a spatially mapped array of pixel values, and is usually streamed to the lithography machine during exposure of the wafer. A data path and lithography system are disclosed in co-pending U.S. patent application Ser. Nos. 61/179,761, 61/179,762, 61/179,765 and 61/179,766, Serial Nos., which are all assigned to the owner of the present application and are all hereby incorporated by reference in their entirety.

Designers of semiconductor devices typically generate layout designs for the devices using a multi-layer vector data format such as GDS-II or Oasis. This pattern data describes the shapes and sizes of the features (transistors, lines, pads, via holes etc.) of the devices to be manufactured from a silicon wafer or other substrate. The wafer is exposed by light or charged particle beams to reproduce the features defined by the pattern data on the surface of the wafer.

Figure 5A:
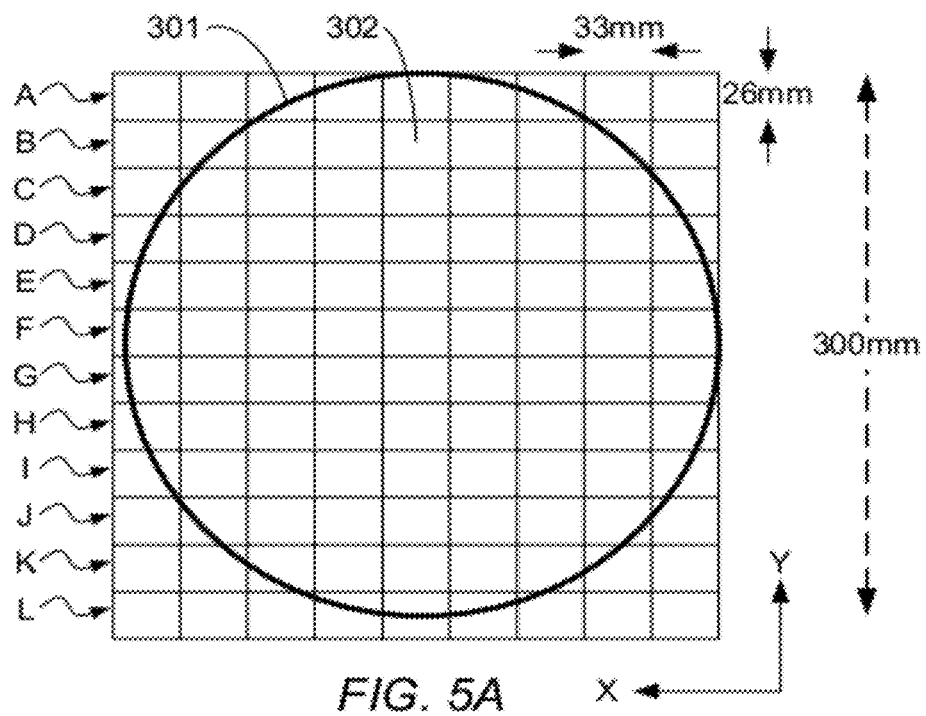
FIG. 5A is a diagram of a wafer divided into fields.

The current industry standard is a 300 mm wafer. FIG. 5A shows a wafer 301 divided into fields 302. Rectangular fields are usually defined on the surface of the wafer, typically with a maximum dimension of 26 mm×33 mm. Each field may be processed to produce multiple semiconductor devices (i.e. the pattern data for exposing a single field may include the layout design for making multiple integrated circuit devices) but the layouts for individual devices do not cross a field border. With a maximum size of 26 mm×33 mm there are 63 fields available on a single standard wafer. Smaller fields are possible and will result in a higher number of fields per wafer. The pattern data usually describes the features of a single field, and the same pattern data is usually used to the entire wafer, so that each field of the wafer is exposed with the same pattern. It is also possible to write partial (incomplete) fields, for example by writing full fields into the partial fields and crossing the wafer boundary.

In a preferred embodiment of the lithography machine, the machine generates 13,000 subbeams and each subbeam is split into 49 beamlets, resulting in 637,000 beamlets (i.e. 13,000×49). The beamlet blanker array contains 13,000 photo diodes and 637,000 holes in an area of 26×26 mm. Each photo diode in the beamlet blanker array receives a multiplexed control signal for control of 49 (7×7) blanker holes/beamlets. The 13,000 subbeams over a distance of 26 mm result in a stripe of width 2 μm in the y-direction (perpendicular to the mechanical scan) and as long as the field in x-direction. The 49 beamlets of each subbeam write a single stripe.

Figure 5B:
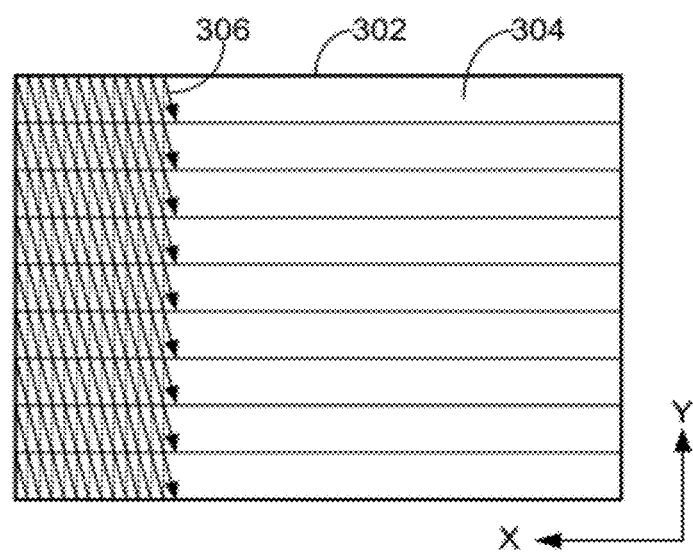
FIG. 5B is a schematic diagram of a field divided into several stripes.

FIG. 5B is a schematic diagram of a field 302 divided into several stripes 304 running the length of the field in the x-direction. The writing direction of the beamlets in each stripe is illustrated by the lines 306, showing the beamlet scan deflection in the y-direction while the wafer stage moves in the x-direction, creating a triangular shaped scan path. Note, that the beamlets typically only write while scanning in one direction, and are turned off during the return sweep (returning beamlets to the starting y position).

The wafer is preferably written on (exposed) by the lithography machine in both a forward and backward x-direction (i.e. +x and −x direction). The direction of writing in the y-direction (by the beamlet scan deflector) is usually in one direction.

When the size (height) of a field is chosen to be smaller than the size of the electron/optical (EO) slit (i.e. the size of the complete array of beamlets as projected onto the wafer) (e.g. smaller than the maximum size of 26 mm), then more fields can be placed on the wafer, but not all of the beamlets will be used to write on the wafer. The EO slit will need to scan the wafer more times and the overall throughput will decrease.

When a machine is writing patterns to a field, at some moment the beamlet blanker array enters the next field and starts writing patterns in it, so the machine should be able to write in two fields at the same time. If a field is sufficiently small, the machine should be able to write 3 fields at the same time.

The process for writing wafers in the lithography machine may be roughly described in the sequence of the following steps. A wafer 121 is installed on the stage of the wafer positioning system 101, the column 102 is maintained in vacuum conditions, and the beamlets are calibrated. The wafer is aligned mechanically, and per field alignments (offsets) are calculated. The wafer is moved in the +x direction by the stage (the x direction also referred to herein as the mechanical scan direction) and the column starts writing the first field, the beamlets being scanned in the y-direction perpendicular to the x direction. When the leading row of holes of the beamlet blanker array passes a field boundary, offset corrections are installed for the next field. Thus, while the first field is still being written, the lithography system will start to write the next field. After writing the last field in a row, the stage will move to position the next row of fields on the wafer under the beamlet blanker array. A new run will start while the stage moves in the −x direction (i.e. the reverse of the +x direction). The direction of the scan deflection preferably does not change.

The pattern data file describing the pattern to be exposed on the wafer is normally generated in vector format, typically an industry standard format such as the GDS-II or OASIS format.

Off-Line Pre-Processing

A preprocessing step transforms the standard vector data format into vector data and a dose map. The preprocessing may include flattening, proximity effect correction, resist heating correction, and other manipulations and corrections.

The flattening step transforms the standard pattern data file, which typically includes design data describing multiple layers of a device design, and contains hierarchical data structures, into single layer two-dimensional pattern data in vector format. The vector data describes the two-dimensional shapes of the patterns to be exposed on the wafer. The dose map comprises exposure dose values for different areas on the wafer, and is usually calculated during preprocessing. The dose map may be implemented as a grid containing one dose rate per cell of the grid, the cell size being typically equal to or smaller than the desired critical dimension (CD) for patterning the wafer. The dose map preferably comprises only background dose values, but may comprise foreground dose values or both background and foreground values. The dose map can also be implemented in the pattern data as a tag for each two-dimensional shape, describing the dose of that shape.

Proximity effect correction may be performed during the preprocessing, to improve the pattern fidelity after processing of the wafer. Proximity effect corrections can be addressed by modifying either the dose value and/or geometry to account for scattering of electrons/particles of the exposure beams. Geometry changes can be done by shifting one or more edges of a feature, e.g. by adding small serifs, typically with length of one third of the CD, around corners of the feature shape or somewhere along the length of a line described by the pattern data. Resist heating correction may be performed to compensate for effects occurring as a result of the properties of the resist used.

The data for each field may also be split into stripes, typically 2 micron wide, to be written by one channel of the system. This may be done by splitting the field dose map into a dose map per channel, and reducing polygons to the stripe area written by one channel. The stripe area preferably extends beyond the borders of the stripe, to account for stitching strategy and dithering startup artifacts. If a "smart boundary" stitching strategy is used, where critical features are assigned to a single channel/stripe, then the critical features of polygons on the stripe boundary are assigned to a particular stripe/channel when splitting up the dose map.

Because of the complexity of the preprocessing, this step is preferably performed off-line, is usually performed by software, and is usually performed once for each design (i.e. the preprocessing step is not performed again for a design unless the design itself is changed).

Processing

Figure 6:
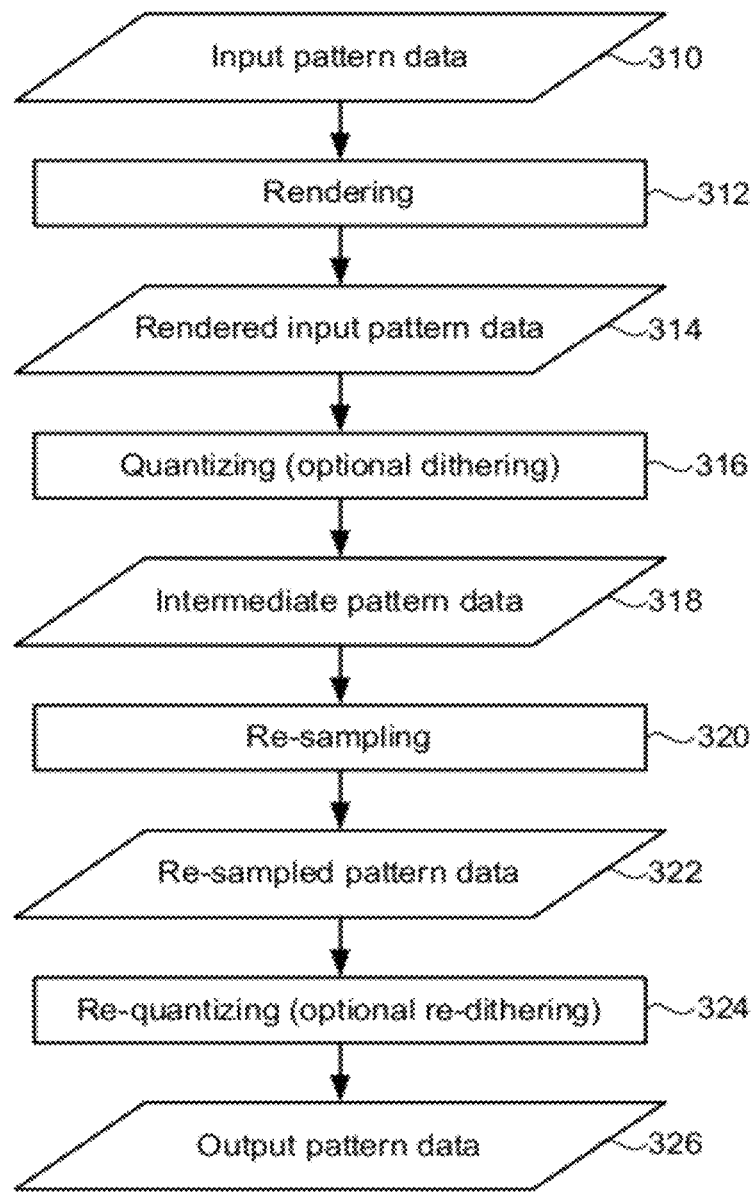
FIG. 6 is a simplified flow chart illustrating a process for converting input pattern data in vector format into output pattern data suitable for modulating the beamlets of a maskless lithography machine.

FIG. 6 is a simplified flow chart illustrating a process for converting the input pattern data in vector format into output pattern data in the form of a spatially mapped array of pixel values, suitable for modulating the beamlets of a maskless lithography machine. The preprocessed input pattern data 310 is rendered in step 312 to generate rendered input pattern data 314, which is then quantized in a first quantization step 316 to generate intermediate pattern data 318. Quantization may be performed by rounding to the nearest intermediate pattern level, and either discarding the quantization error or re-distributing the error over adjacent pixels using error diffusion dithering. In the next step the intermediate pattern data 318 is re-sampled in step 320 to generate re-sampled pattern data 322, which is quantized again and optionally dithered (referred to herein as re-dithering) in a second quantizing step 324 (referred to herein as re-quantizing) to generate output pattern data 326, which is transmitted to the lithography machine to control the beamlets to expose the target.

Figure 7:
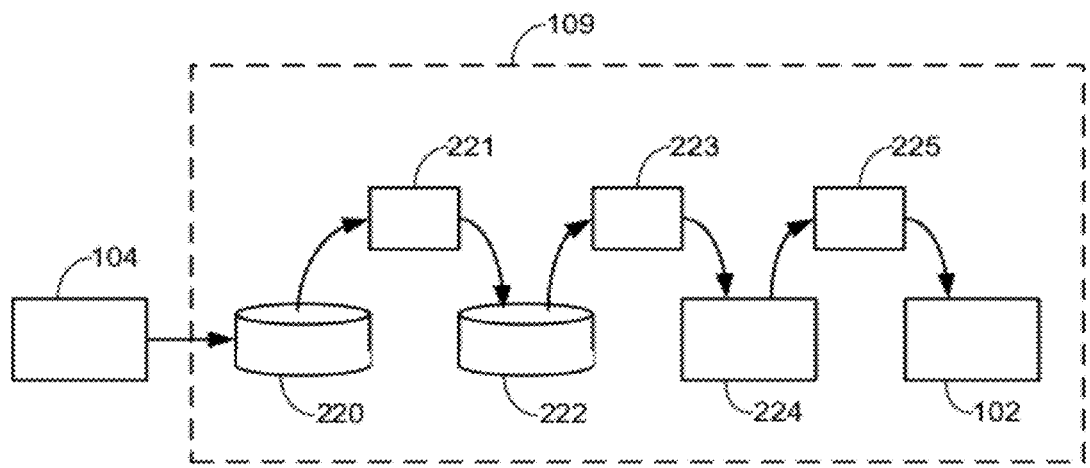
FIG. 7 is an example of an architecture for performing the process of FIG. 6.

FIG. 7 shows an example of an architecture for performing the operations of FIG. 6. A preprocessing system 104 uploads the input pattern data 310 to the lithography tool 109 where it is stored in a first storage medium 220, e.g. a hard disk drive. The input pattern data is read from storage 220 and rendered and quantized (and optionally dithered) by processor 221 to generate intermediate pattern data 318, which is stored in a second storage medium 222, e.g. a hard disk. These steps of the process are usually performed in advance of beginning exposure of the wafer, storage 220 and storage 222 typically storing the pattern data for a complete field. The intermediate pattern data is in the form of a spatially mapped array of pixel values (referred to herein as a bitmap) which has a deterministic size so that the necessary storage capacity to store the intermediate pattern data, e.g. storage 222, can be determined in advance.

The intermediate pattern data 318 is then read from storage 222 and the coordinate transformation and re-quantization (and optionally re-dithering) is performed by processor 223 to generate output pattern data 326, which is stored in storage medium 224, which is usually some form of digital memory, e.g. RAM. These steps are usually performed in real-time, at least in part during exposure of the wafer, storage 224 typically storing the pattern data for only part of a field, The output pattern data is read from storage 224 and transmitted to the column 102 by a data transport system 225.

Off-Line, In-Line and Real-Time Processing

The data size of the intermediate pattern data is preferably maintained constant for a design, such that if the number of bits per pixel is increased, the size of the pixels also correspondingly increases, and vice versa. For example, if a pixel size of 2.5 nm for bi-level B/W intermediate pattern data would provide sufficient precision, the pixel size would be increased to 5 nm if 4-bit per pixel multi-level intermediate pattern data was used. For example, for a 26×33 mm wafer field, 2.5 nm bi-level (1-bit per pixel) pattern data would require approximately 137 Terabits of storage space (not including any overlap between adjacent stripes).

The rendering and quantization to convert from vector format input pattern data (and optional dose map) to intermediate pattern data is preferably performed once per batch of wafers processed using the pattern data, and may be performed off-line, in-line or on-line. Off-line conversion is typically performed in software by a data processing system separate from the lithography machine. Off-line conversion has the advantage that there is usually no time constraint so that processing time is not usually an issue. However, converting the vector pattern data into bitmap format considerably increases the size of the data, increasing the amount of storage capacity needed to store the data, e.g. on a hard disk drive or other magnetic or optical storage media. A large number of chip designs would require a large amount of storage space if stored in bitmap format. Any changes to a chip design made after conversion to bitmap format would also require reconversion.

The conversion to intermediate pattern data may also be performed "in-line" during upload of the input pattern data to the lithography machine, typically performed in software by a data processing system included as part of the lithography machine. In-line conversion has the advantage that the conversion is delayed until shortly before the data is to be used, reducing the off-line storage capacity required. The in-line conversion may take about an hour per pattern converted. Where the lithography machine has the required data processing capability, this method may be advantageous.

The conversion to intermediate pattern data may also be performed in real-time, shortly before the exposure begins or after it has started. This may be performed during upload from hard disk to the pattern streamer system which streams the bitmap data to the blanker array of the lithography machine. This requires fast upload and typically may take about six minutes per pattern for upload, and conversion. Processing time is critical for this option to prepare the pattern data for immediate use.

Rendering

Referring back to FIG. 6, the input pattern data 310 is rendered in step 312 to generate rendered input pattern data 314. The rendering process converts the shape information described in a vector format into a format comprising image data per area of the image, such as squares of a grid, areas of an array, or data for each pixel.

Figure 8A:
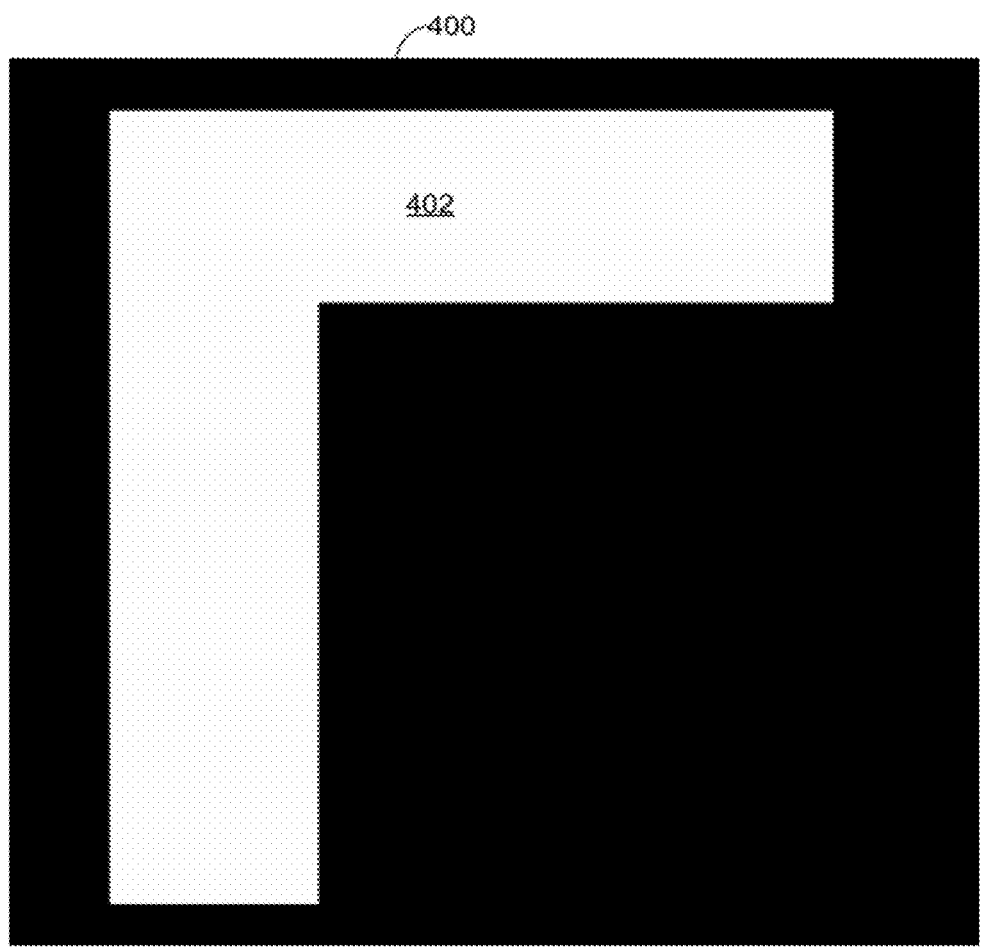
FIGS. 8A to 8I are diagrams showing steps of converting input pattern data in vector format into output pattern data.
Figure 8B:
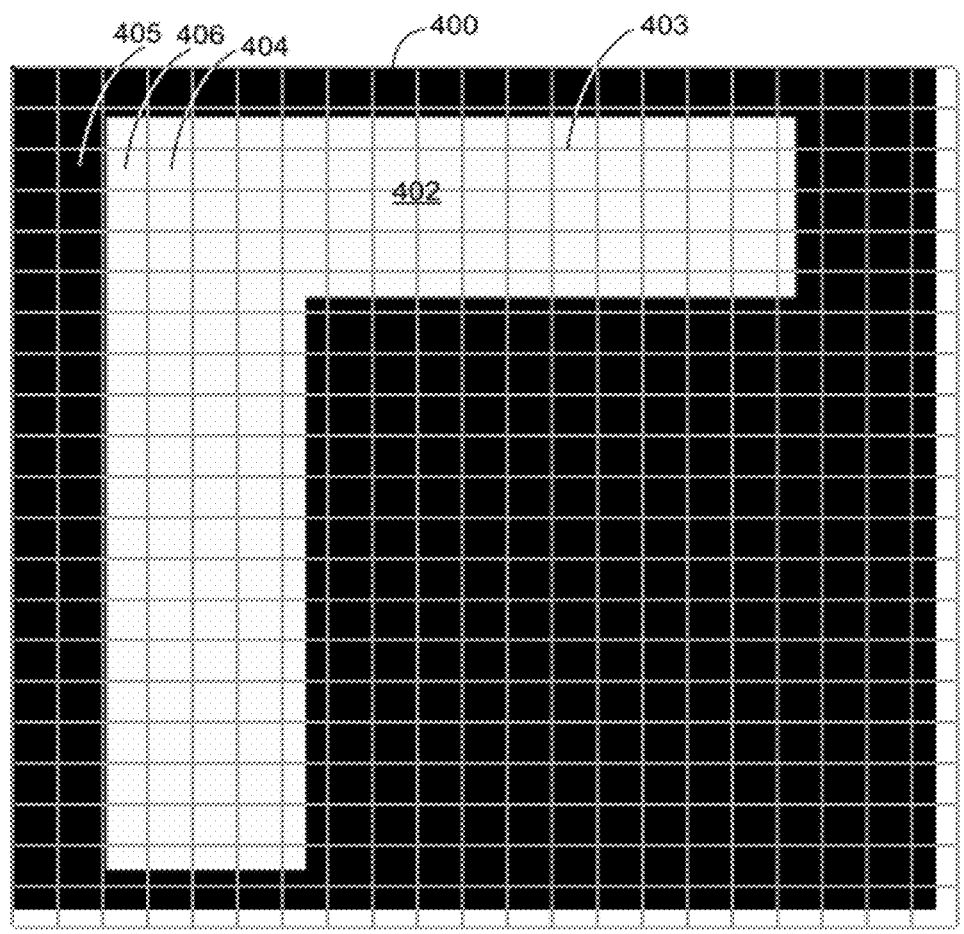
Figure 8C:
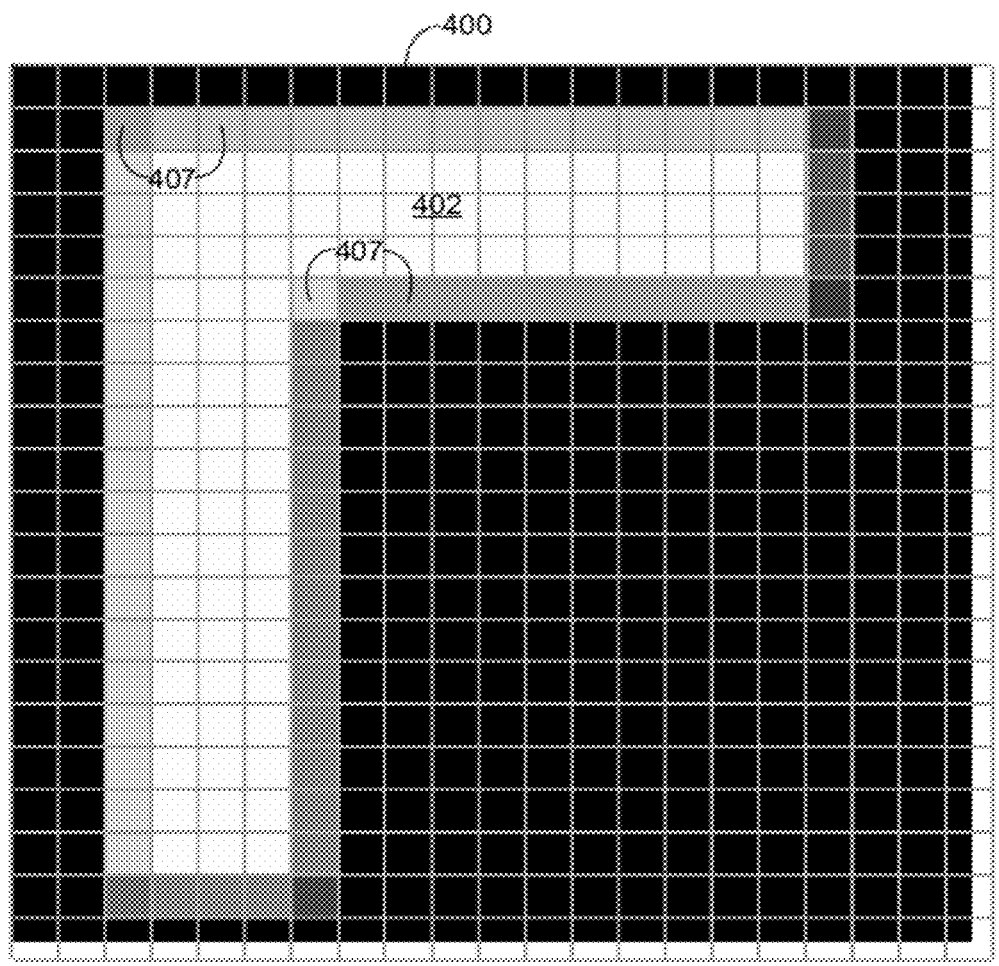

FIG. 8A shows a representation of a portion 400 of input pattern data, showing a white shape 402 on a black background representing a feature to be exposed on the target. FIG. 8B shows the image area of FIG. 8A overlaid with an input grid 403 to illustrate one method for rendering the input pattern data. For each cell of the grid defines a value related to one element of the pattern to be exposed on the target, and will hereafter be referred to as a pixel. Note that a pixel of the pattern data does not necessarily relate directly to a pixel exposed by a beamlet on the target. For each pixel, a value is determined representing the fraction of the pixel occupied by the feature, e.g. the fraction of the grid square of FIG. 8B that is white rather than black. FIG. 8C shows the resulting array of values, also referred to as grey values, forming the intermediate pattern data 314. Although a square input grid is shown in FIGS. 8B and 8C, the grid may also take many other forms such as rectangular grid, square or rectangular grid with rows offset from each other, triangular grid etc.

In one embodiment, a maximum dose, also referred to as the foreground dose, and a minimum dose, also referred to as the background dose, are used. The minimum dose may be zero or may be a non-zero value. Each pixel completely contained inside the feature 402 is assigned a value representing the maximum of foreground dose (e.g. grid square 404 in FIG. 8B), and pixels completely outside the feature are assigned a value representing the minimum of background dose (e.g. grid square 405). Pixels that are partially covered by the feature (e.g. grid square 406) are assigned a grey value proportional to the fraction of the pixel covered by the feature, appropriately scaled between the minimum and maximum dose values (e.g. grid squares 407 in FIG. 8C). The grey values here have in principle infinite resolution with no quantization error, although in practice some quantization always occurs in digital computing systems. The rows of pixels are preferably processed progressively in one direction (e.g. from top to bottom), each row being processed in the same direction (e.g. from left to right), processing may also be performed in two directions, e.g. in a serpentine pattern.

The input pattern data is preferably accompanied by dose information, preferably in the form of a dose map. If present, the dose information is preferably taken into account when generating the intermediate pattern data. For example, the grey value determined for each pixel of FIG. 8B may comprise the fraction of the pixel occupied by the feature, scaled between minimum and maximum dose values, and multiplied by the relevant dose value for the area covered by the pixel.

First Quantization

Figures 8D, 8E:
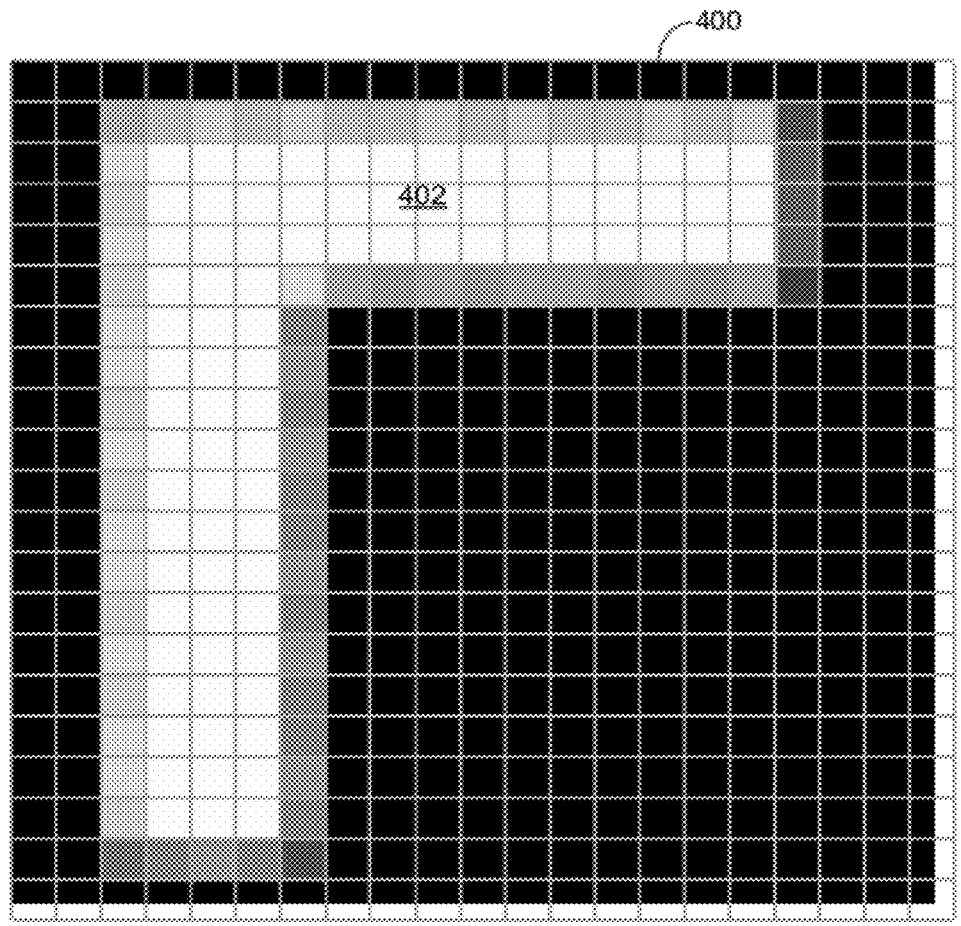

Referring back to the flowchart of FIG. 6, the intermediate pattern data 314 determined by the rendering step is then quantized to enable storage of each value with a predetermined resolution defined by a certain number of bits. Quantization is usually done by rounding to the nearest n-bit intermediate pattern level. For example, if each value is represented by four bits, the quantized values could take one of 16 different values, e.g. representing 16 grey scale values. Quantization error is generated in this step, which may be discarded or optionally redistributed over adjacent pixels using error diffusion dithering. A first quantization step 316 including a first dithering is used to perform quantization and error diffusion to generate n-bit intermediate pattern data 318 as shown in FIG. 8D. After quantizing, the quantization error for one pixel value is propagated to neighboring pixels by the first dithering process to avoid loss of the quantization error and improve the accuracy of the intermediate pattern data.

FIG. 8E illustrates an example of a two dimensional quantization error propagation process. In this example, each grey value of the intermediate pattern data is quantized to a four bit value defining one of 16 possible grey levels. As each pixel is processed, the quantization error is diffused to neighboring pixels. In this example, the error is diffused in two dimensions, i.e. to the neighboring pixel in the direction of dithering and to the next row which has not yet been dithered. Note that in the example shown, the dithering process is proceeding from left to right and from top to bottom. The top row and first pixel of the middle row have already been processed. The center pixel is being processed, and the quantization error is being distributed to the next pixel to the left (in the direction of dithering) and to the next row down (also in the direction of dithering). Dithering techniques are typically used for realizing grayscales or color variations when printing. Some well known algorithms are error diffusion (2×2 matrix) and Floyd Steinberg (2×3 matrix), and dithering techniques are also disclosed in U.S. patent application No. 61/179,760. Dithering is typically performed in one direction, e.g. dithering rows of pixels progressively in one direction (e.g. from top to bottom) and dithering each row in the same direction (e.g. from left to right), but may also be performed in two directions, e.g. in a serpentine pattern. Dithering algorithms typically need some data to "warm up", and the stripe width may be extended with small margins for a better result.

For lithography purposes, some improvements may be made to the dithering process. Error propagation is preferably not propagated across feature edges of the pattern data, but is instead preferably propagated in another direction, but may also be discarded, since it is generally not useful to propagate a quantization error to pixels where no dose or only background dose is desired. One should see this also in the light of reasonable values for CD and pitch. In case of a transition from a gray value to a zero value this guaranties that more zero pixels will follow.

Another improvement to the dithering process is to restrict error diffusion by disallowing diffusion towards one or more pixels that have a value that differ more than a certain amount from the pixel being processed. Because pixels on the edge of a feature, the interior of a feature, and the exterior of a feature may have values that differ significantly from each other, this method ensures that the error stays either at the edge, the interior or the exterior of the feature.

More complex rules are also possible. These are preferably calculated during preprocessing, and the result can then be stored as a label for each pixel describing the outcome of the shift rule for that pixel. The error diffusion is then restricted by disallowing diffusion towards one or more pixels that have a different label than the pixel being processed.

Because the dithering process propagates quantization error to neighboring pixels, it also deals with the subpixel shift per scan line. To propagate the quantization error in an accurate way, error propagation to another scan line is not trivial where the scan lines are not aligned, e.g. where pixels in adjacent rows are offset from each other. The quantization error may be propagated on the basis of the amount of overlap between the neighboring pixels, so that pixels with a greater overlap receive a greater proportion of the propagated quantization error. An alternative and simpler strategy is to propagate the error only to the neighbor that has the biggest overlap.

Note that although the rendering 312 and first quantization (and optionally the first dithering) 316 are described as separate steps, both processes are usually applied on each pixel before the next pixel is processed.

Re-Sampling

Referring back to the flowchart of FIG. 6, in the next step the intermediate pattern data 318 undergoes a re-sampling operation 320 to generate re-sampled pattern data 322. The re-sampled pattern data 322 is preferably matched to the beamlet resolution of the lithography machine without requiring further coordinate transformation. For example, the pixel size of the re-sampled pattern data preferably matches the desired pixel size of the beamlets on the target surface.

Figure 8F:
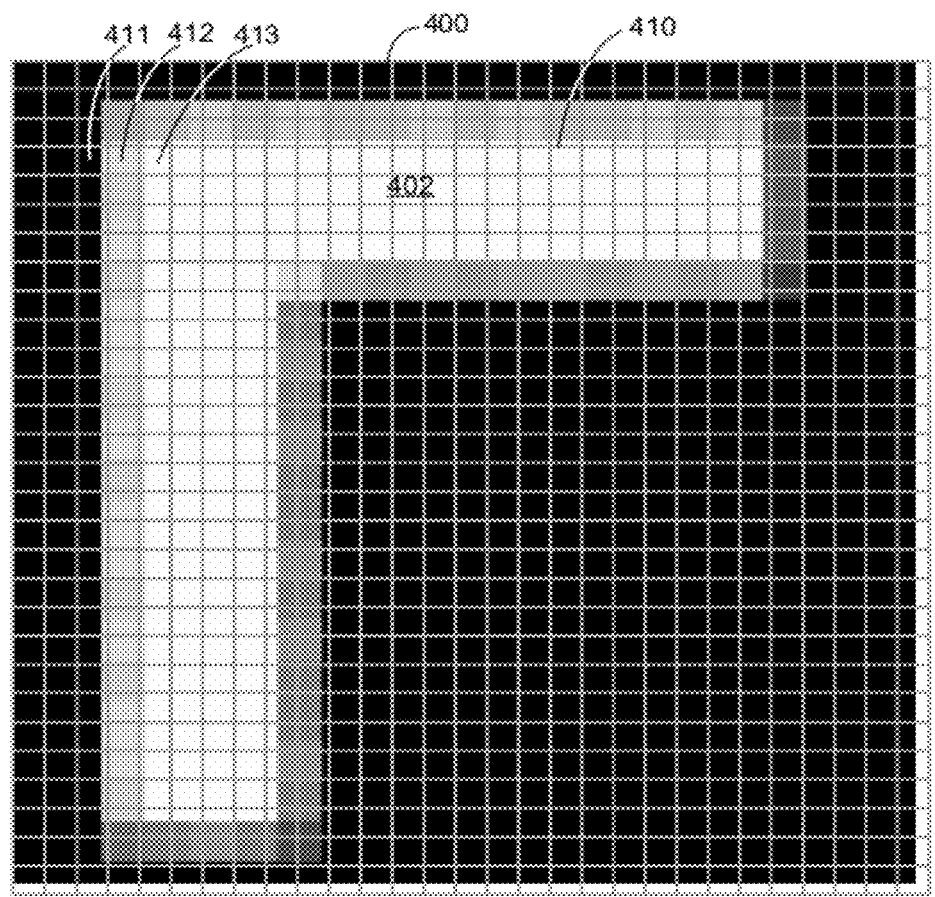

FIG. 8F illustrates an example of the re-sampling. The quantized intermediate pattern data of FIG. 8D is shown overlaid with an output grid 410. The output grid 410 preferably defines smaller pixels than the input grid 403, the output grid 410 preferably matching the desired pixel size of the beamlets on the target surface. For example, for a desired pixel size of 3.5 nm, each pixel of the output pattern data represents a dose value for a beamlet for exposing a 3.5 nm pixel on the target. The pixel of the re-sampled pattern data and the output pattern data is preferably equal to the pixel size for streaming to the lithography machine.

Figure 8G:
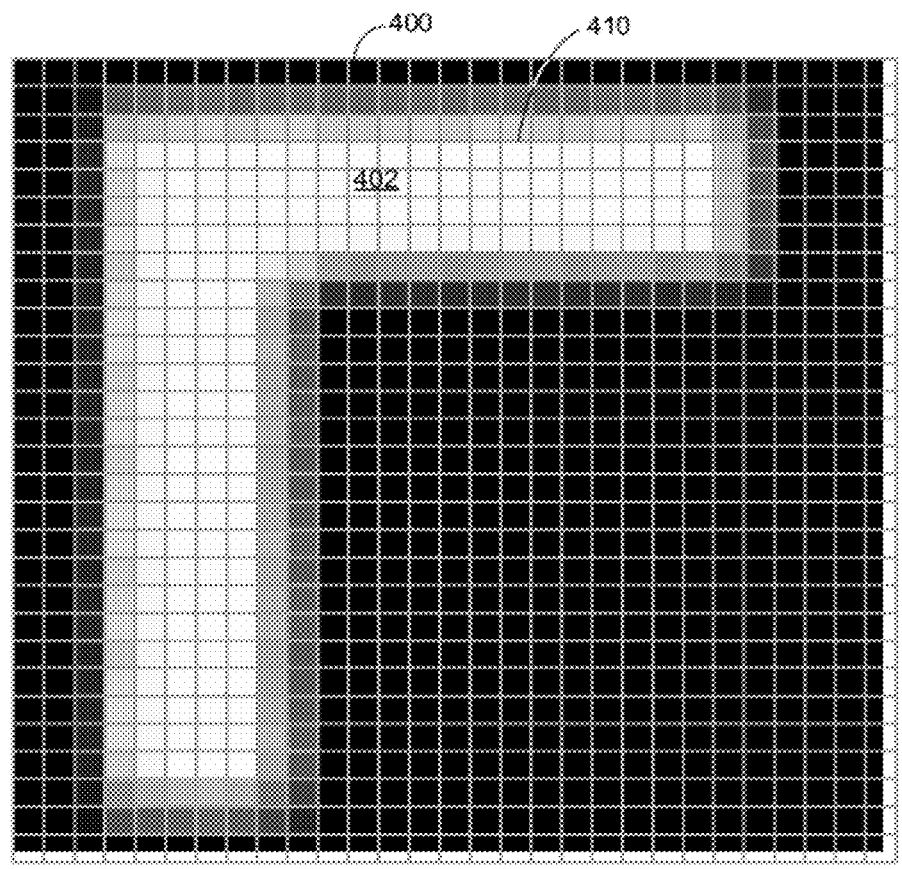

For each cell/pixel of the output grid 410, a value is determined representing the dose values of the intermediate pattern data falling within the re-sampled/output pixel and fractions of the output pixel occupied by those dose values. For example, in FIG. 8F pixel 411 is mostly black with a small area of light grey, pixel 412 is entirely light grey, and pixel 413 mostly white with a small area of light grey. The weighted "average" grey values for the re-sampled pixels are determined based on the intermediate grey values (e.g. black, light grey, white) and the fraction of the pixel they occupy. FIG. 8G shows the resulting array of grey values forming the re-sampled pattern data 322. Although a square output grid is shown in FIGS. 8F and 8G, the grid may also take many other forms such as rectangular grid, square or rectangular grid with offset rows, triangular grid, etc.

Similarly to the rendering step, the grey values of the re-sampled pattern data have in principle a sufficiently low quantization error, although in practice some quantization always occurs in digital computing systems. The rows of pixels are preferably processed progressively in one direction (e.g. from top to bottom), each row being processed in the same direction (e.g. from left to right), processing may also be performed in two directions, e.g. in a serpentine pattern.

Corrections may be applied as part of or in conjunction with the re-sampling step. The re-sampling is preferably performed in real-time so that these corrections are also real-time corrections. The corrections may include, for example, beam-to-beam dose correction, shifting within a stripe, and scaling within a stripe.

Shifting

Shifting within a stripe can be applied, in the x-direction (mechanical scan direction), y-direction (perpendicular to the mechanical scan direction), or both directions, by moving the origin of the output grid with respect to the origin of the input pattern data. The value of grey level in each re-sampled/output pixel is then determined as above When a pattern is written on a wafer, it is unlikely that the beamlets writing the pattern are all perfectly aligned. To correct for this misalignment and enable the beamlets to write aligned stripes, the pattern data is adjusted to compensate for the alignment errors. This adjustment may be made using software or hardware, and can be done at different stages during processing of the pattern data. For example, the corrections can be made to the input, intermediate or output pattern data.

Offsets of beamlets may occur in the x-direction (direction of stage movement) or y-direction (direction of beamlet scan deflection) or both. Offsets may occur in a full pixel shift and/or subpixel shift. A full pixel shift may be achieved by shifting a number of pixels after rasterization. A subpixel shift can be achieved as part of the rasterization process.

Figure 9:
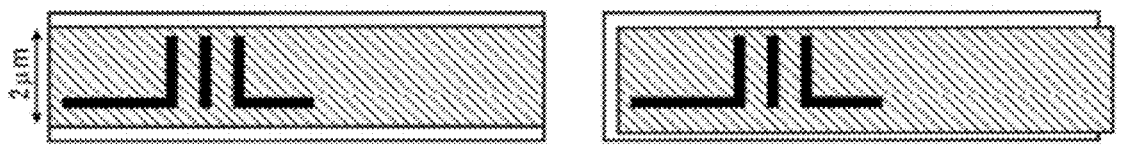
FIG. 9 is a diagram of an x and y pattern shift for stripe position correction.

Global pattern shifting (i.e. a shift of all beamlets in a channel) may be used for stripe position correction (in x- and y-direction) and field position correction (in x- and y-direction). An example of an x and y pattern shift for stripe position correction is shown in FIG. 9. On the left of the drawing, a stripe is shown with the desired pattern overlaid in the intended position. On the right of the drawing, a stripe is shown with a pattern overlaid as it would be written if no correction was made. As can be seen, a global pattern shift is required to cause all beamlets of the channel to write in a position shifted up and to the left.

Beam offsets are typically done frequently after calibration (once per wafer or field). It can be assumed that beamlets are aligned perfectly with respect to the other beamlets in the same channel, so that all beamlets in a channel get the same pattern offset.

Typical requirements for pattern shifting are individual x and y shift settings per channel for global shifting, and a parameter update once per field. A typical maximum shift range may be +200 nm to −200 nm, with a shift accuracy of 0.1 nm. This correction is per channel for global shifts because it is expected that all beamlets in a patterned beam use the same offset values. For a global pattern shift, the channel pattern is shifted as a whole independent of the beam interleaving strategies.

Scaling

Scaling may be used to correct for variations in the scan deflection of the beamlets. Beamlets are deflected during each scan in the y-direction and write a pattern from one side of the stripe to the other side. The deflection distance preferably covers both the stripe width and two times an overscan distance. In case the deflection of the beams generated by the lithography machine is not perfectly uniform over all beams, one group of beamlets will be deflected more strongly than others and therefore deflection distances will be different between groups of beamlets. Differences in the strength of the scan deflection may occur over the surface of the scan deflection array due to voltage drops occurring across the array. These voltage drops result in a weaker deflection field at the far ends of the array, and the deflection distance will be shorter for beamlets experiencing the weaker deflection fields.

Figure 10:
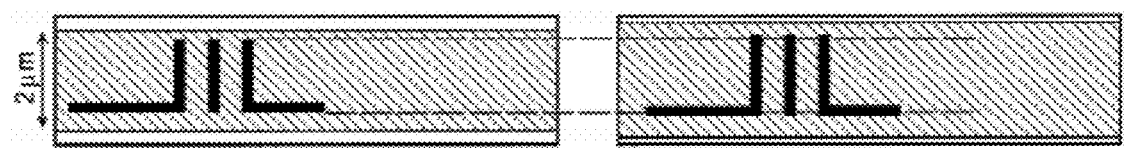
FIG. 10 is a diagram of a y direction pattern scaling.

Scaling can be applied by magnifying or demagnifying the intermediate pattern data by a scaling factor, by scaling the output grid 410 and then performing the re-sampling as described above. This scaling correction is usually applied within a stripe in the y-direction (perpendicular to the mechanical scan direction). The center of the stripe usually remains the same before and after the scaling. An example of pattern scaling is shown in FIG. 10. On the left of the drawing, a 2 micron wide stripe is shown with the desired pattern overlaid with the intended scaling of the pattern feature between the horizontal dashed lines. On the right of the drawing, the stripe is shown with a pattern overlaid as it would be written if no scaling correction was made. As can be seen, a pattern scaling correction is required to reduce the deflection of all beamlets of the channel to write the feature with the correct scaling.

Scaling may be accomplished by adjusting the bit rate of the data signal transmitted to the beamlet blanker of the lithography machine, spreading the exposure pattern over a different number of pixels. Due to synchronization considerations, changing the bit rate is not preferred. To avoid this, scaling may be done by spreading the pattern over a different number of bits/pixels. It is assumed that beamlets belonging to a single group of beamlets have the same deflection strength, because they are deflected by the same deflector element of the scan deflection array. The pattern scaling factor is thus the same for all beamlets in the same group.

Pattern scaling requires correction per channel, with correction parameter update preferably once per redundancy scan reshuffle. Maximum range is typically 1 to 1.1 (e.g. 2 µm becomes 2.2 µm) with accuracy of 0.1 nm/1 µm=1/10,000. Deflection strength is assumed to be the same for all beamlets in a channel because the beamlets share the same deflector array, and are more or less in the same position in this deflector.

Rotation and Distortion

Corrections may also be made to correct for a rotation or distortion of the pattern with respect previous pattern layers formed on the target. This may be done by rotating or distorting the output grid 410. The distortion and rotation can be used to improve overlay performance or matching with another layer exposed or generated by a different lithography tool. The distortion can comprise, for example, field size adjustment, field position adjustment, rotation of the field, asymmetrical field size adjustment, and asymmetrical rotation. Higher order corrections are also possible. By using this process, any distortion of the field of the wafer can be compensated by appropriately distorting the output grid 410.

Dose Corrections

A maximum (foreground) dose and minimum (background) dose may be used in the rendering step as described above. A beamlet-to-beamlet dose correction may be applied in the second dithering step by individually adjusting the threshold value (or equivalent) per stripe. Because of manufacturing tolerance variations in the lithography machine, the effective dose varies per beamlet. Variations in beamlet scan deflection strength can also result in a variation of dose intensity. These variations may be corrected by applying a dose correction factor, for example by multiplying the calculated output pattern data values by a dose correction factor. The dose correction may also be applied in the second dithering process by adjusting pixel white values and/or threshold values. For example, when a beamlet is calibrated with a dose factor of 90%, its intensity is 100%/90%=111.1%. Thus, the white value used for dithering would be 111.1 if 100 were the default, and dithering threshold value would be 55.6 if the default was 50. Dose correction is preferably performed per beamlet, with dose correction factor preferably updated once per wafer. Typical requirements/values for dose correction are a dose map of 50%-100%, pattern dose accuracy of 0.2% step size, beam dose correction factor of 80%-100%, and beam dose accuracy of 0.2% step size. The resulting dose rate should be rounded to the nearest value.

The dose used for the dithering process may be calculated based on the dose rate from the intermediate pattern data, a dose factor per beamlet, and a scaling factor for the channel. The dose factor is preferably set per beamlet. The dithering module should also know the scan line to beamlet binding ("subbeam index"). The dithering process will result in dose levels or preferably an on/off state for all pixels of the stripe. Before further processing the optional margin pixels are removed. Margin pixels are not needed in case of soft edges because there is already a smooth fade in and out at the stripe borders. For the dithering process to generate bi-level output pattern data, the threshold is preferably always half of the 'white value', because the white value will deviate from the default because of beamlet dose corrections.

Second Quantization

Figure 8H:
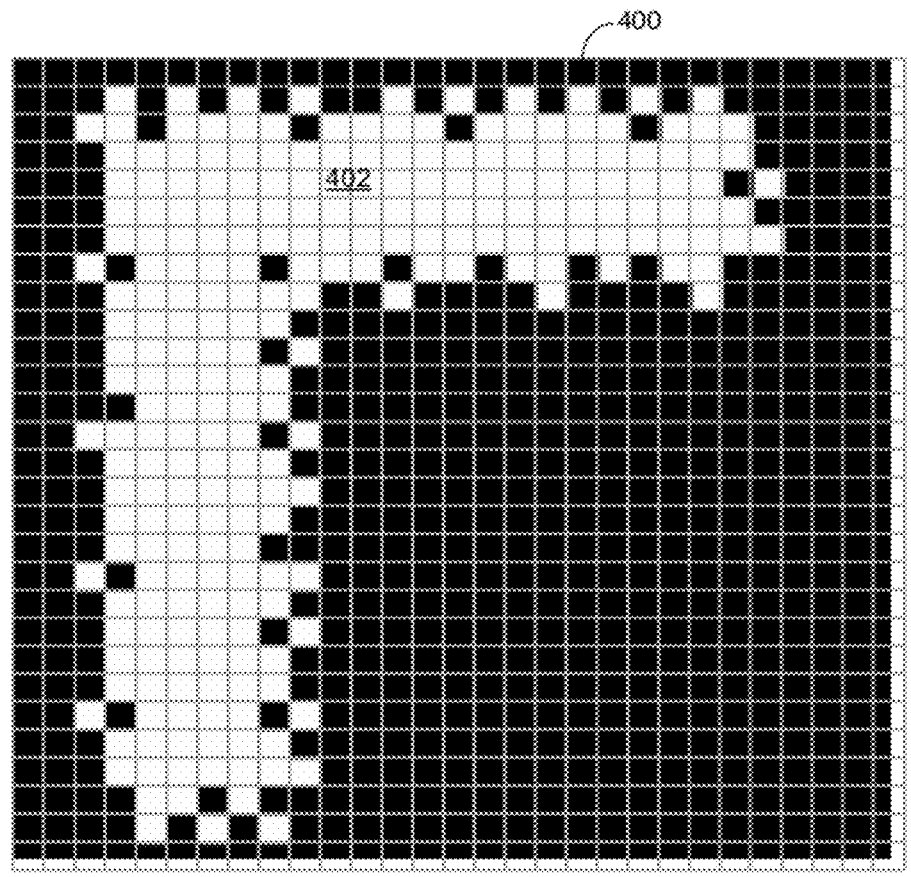

Referring back to FIG. 6, the output pattern data 322 is quantized in a second quantization step 324 to generate output pattern data 326. The output data is preferably a black/white bitmap comprising pixel dose values quantized to 1-bit values per pixel. Diffusion of the error quantization may optionally be performed in a second dithering step, also referred to as re-dithering (this is referred to herein as re-dithering although a first dithering step may not necessarily have been performed, so that the conversion process may include re-dithering as the only dithering step). FIG. 8H shows the output pattern data of FIG. 8G converted into bi-level output pattern data.

Figure 8I:
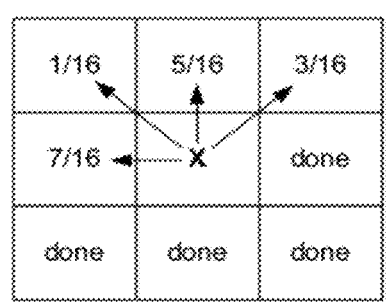

FIG. 8I illustrates an example of a two dimensional quantization error propagation process for a second dithering step, similarly to FIG. 8E for the first dithering. In this example, each grey value of the output pattern data is quantized to a four bit value defining one of 16 possible grey levels. As each pixel is processed, the quantization error is diffused to neighboring pixels in two dimensions. In FIG. 8I, the dithering process is proceeding from right to left and from bottom to top, opposite to the dithering direction shown in FIG. 8E. The bottom row and third pixel of the middle row have already been processed. The center pixel is being processed, and the quantization error is being distributed to the next pixel to the right (in the direction of dithering) and to the next row up (also in the direction of dithering).

Similarly to the first dithering, the second dithering is typically performed in one direction, e.g. dithering rows of the grid squares progressively in one direction (e.g. from top to bottom) and dithering each row in the same direction (e.g. from left to right), but may also be performed in two directions, e.g. in a serpentine pattern. Note that although the re-sampling 320 and second quantization (and optionally second dithering) 324 are described as separate steps, both processes are usually applied on each output pixel before the next pixel is processed.

The direction in which the second dithering takes place can be chosen to be the same as the direction for the first dithering (e.g. both from left to right and top to bottom), or completely opposite (e.g. first dithering from left to right and top to bottom, and second dithering from right to left and bottom to top), or partially opposite (e.g. first dithering from left to right and top to bottom, and second dithering from right to left and top to bottom).

Figure 11A:
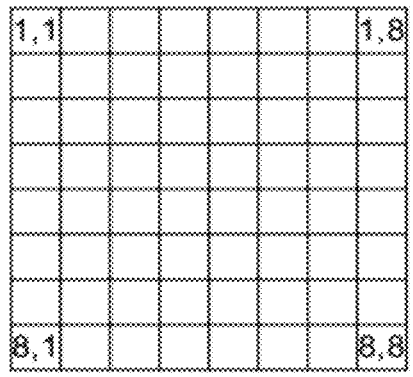
FIG. 11A is a diagram of an 8×8 array of pattern data.
Figure 11B:
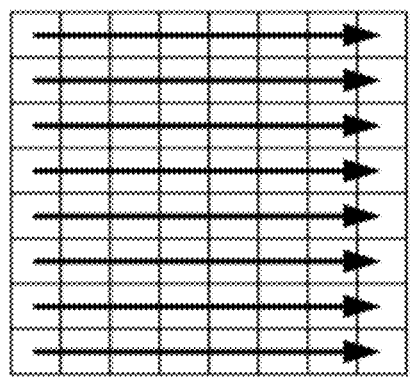
FIG. 11B is a diagram showing a path for the first dithering of intermediate pattern data from left to right and from top to bottom.
Figure 11C:
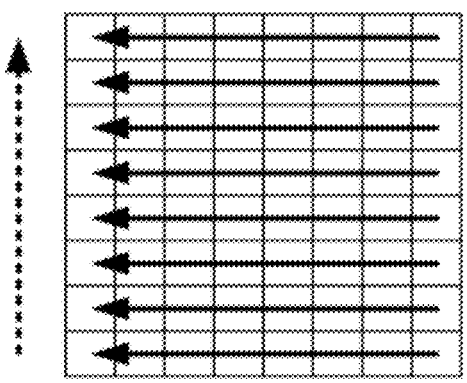
FIG. 11C is a diagram showing a path for the second dithering of intermediate pattern data from right to left and from bottom to top.

The first and second dithering processes are preferably performed in opposite directions. FIG. 11A shows an example of an 8×8 array of pattern data, the values arranged from 1,1 in the top left corner to 8,8 in the bottom right corner. FIG. 11B shows an example of a path for the first dithering of the intermediate pattern data, from left to right and from top to bottom. The first dithering begins at the top left corner and dithers the top row from left to right, then the second row from left to right, and onwards to the bottom row. FIG. 11C shows a path for the second dithering of the output pattern data. The second dithering is preferably performed in the opposite direction to the first dithering. Thus, in this example, the second dithering will be performed from right to left and from bottom to top. The second dithering begins at the bottom right corner and dithers the bottom row from right to left, then the next row up from right to left, and onwards until the top row.

It has been found empirically that performing the dithering in opposite directions leads to a small improvement in the accuracy of the pattern reproduced on the target. While this improvement is desirable, it leads to some problems. As described above, an industry standard 300 mm wafer is usually divided into fixed size rectangular fields as shown in FIG. 5A, and the pattern data usually describes the features of a single field. The same pattern data is usually used to expose the entire wafer, so that each field of the wafer is exposed with the same pattern. The fields are usually divided into stripes which run the length of the field in the x-direction, i.e. the mechanical scan direction of wafer stage movement. The beamlets are deflected in the y-direction perpendicular to the mechanical scan direction, so that the stripes are exposed over their surface by beamlet deflection in the y-direction and wafer movement in the x-direction, as shown in FIG. 5B.

Figure 12A:
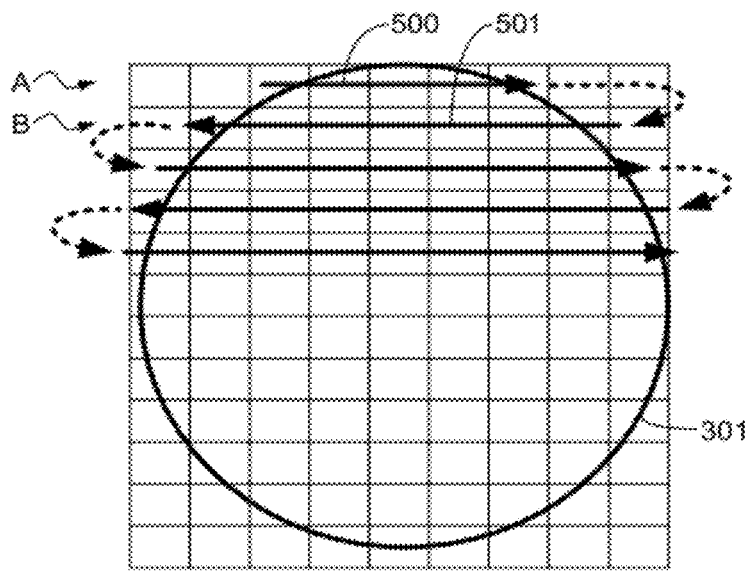
FIG. 12A is a diagram showing scanning a wafer in two directions.

The output pattern data which is used to modulate the beamlets as they scan is usually generated in real time during exposure of the wafer. The output pattern data is usually stored in memory as it is generated and streamed to the beamlet blanker array of the lithography machine. The data is streamed to the beamlet blanker array in the sequence required to expose the wafer field as the wafer is moved in the x-direction under the beamlets. However, the usual method for exposing a wafer involves moving the wafer stage in one direction during exposure of the fields in one lane, and moving the wafer stage back in one opposite direction during exposure of the fields in next lane, so that movement of the wafer stage is minimized. This is illustrated in FIG. 12A, which shows scanning of the lanes of wafer 301. As the wafer stage moves in the x-direction from right to left, the fields in lane A are scanned from left to right (along path 500) as they come under the beamlets of the lithography machine. When all the fields in lane A have been exposed, the wafer stage moves upwards in the y-direction to position lane B under the beamlets. The wafer stage now moves in the opposite direction, from left to right, so that the fields in lane B are scanned from right to left (along path 501) as they come under the beamlets.

This means that the direction in which the beamlets scan the fields in alternating lanes is reversed for each lane, e.g. if the fields in lane A are scanned from left to right, the fields in lane B are scanned from right to left. If the pattern exposed in each field in each lane is to have the same orientation, then the output pattern data should be provided to the beamlet blanker in the reverse order for each alternating lane. This is problematic if the direction of the second dithering is to be opposite to the direction of the first dithering. Various options are available to address this issue.

(1) Two sets of intermediate pattern data may be generated from a single set of input pattern data, the two sets of intermediate pattern data produced using a first dithering process performed in opposite directions. The two sets of intermediate pattern data are then alternated per lane of the wafer. During exposure of the fields in lane A, the first set of intermediate pattern data is used to generate the output pattern data, and during exposure of the fields in lane B, the second set of intermediate pattern data is used to generate the output pattern data. This results in the re-dithering being performed in opposite directions for alternating lanes of the wafer, so that the data is presented to the beamlet blanker array in the correct sequence for exposing the lanes as the wafer stage is moved in each direction. This solution requires storing two sets of intermediate pattern data. For example, in the architecture shown in FIG. 7, this would require doubling the capacity of the second storage medium 222, and providing means for the processor 223 to read from either one of the two sets of data to generate the output pattern data. As the intermediate pattern data for a 26×33 mm wafer field will typically comprise over 100 Terabits of data, this additional storage capacity adds considerable expense to the lithography system.

Figure 12B:
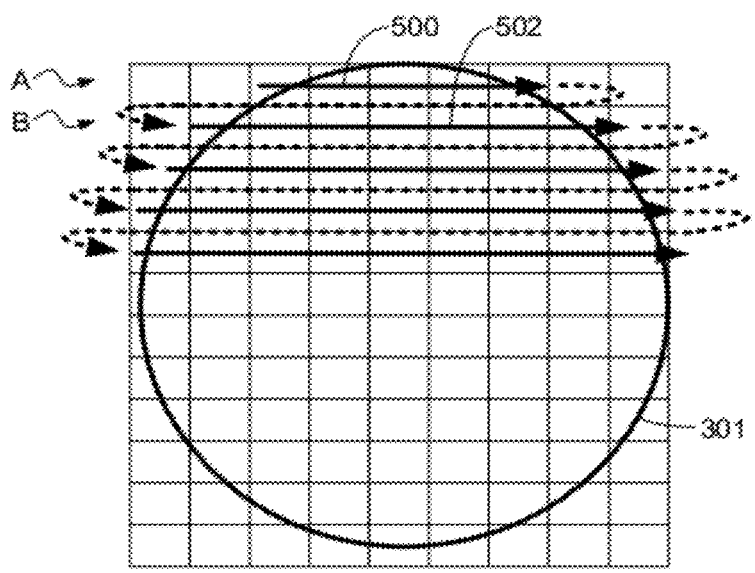
FIG. 12B is a diagram showing scanning a wafer in one direction.

(2) The wafer stage may be moved so that exposure of each lane occurs in the same direction. This is illustrated in FIG. 12B. As the wafer stage moves in the x-direction from right to left, the fields in lane A are scanned from left to right (along path 500) as they come under the beamlets of the lithography machine. When all the fields in lane A have been exposed, the wafer stage moves upwards in the y-direction and from left to right in the x-direction to reposition the wafer with the left-most field of lane B under the beamlets. The wafer stage now moves in the same direction, from right to left, so that the fields in lane B are scanned from right to left (along path 502) in the same direction as lane A. This approach does not require any additional storage capacity, but requires the wafer stage to make an extra movement between scanning each lane. This adds to the total time required to expose the wafer and reduces throughput of the lithography system. However, this can be minimized by designing the wafer stage to move quickly (much faster than the normal scanning movement) during the positioning between exposing each lane.

(3) The wafer stage could be rotated between exposing each lane, so that each lane is exposed in the same direction. This avoids the requirement for the wafer stage to make a return x-direction movement after exposing each lane. However, the difficulties involved in rotating the wafer stage and realigning for exposure of each lane are disadvantages.

(4) The lanes could be exposed with some lanes being exposed with data generated by dithering and re-dithering in opposite directions, and alternating lanes being exposed with data generated by dithering and re-dithering in the same direction. However, this would result in varying specifications for the critical dimension uniformity and overlay uniformity for alternating lanes. The pixel size could be reduced to ensure that the specifications for the critical dimension uniformity and overlay uniformity were acceptable for the lanes with dithering and re-dithering in the same direction. However, this option would result in the semiconductor devices fabricated from fields in different lanes having slightly different performance specifications.

(5) Each alternating lane could be exposed so that the pattern exposed in each field in alternating lanes has a different orientation, e.g. in lane A the fields are upright and in lane B the fields are rotated 180 degrees. However, this would require the same alternating orientation for all layers of the wafer, and is disfavored for this reason.

The invention has been described by reference to certain embodiments discussed above. It should be noted various constructions and alternatives have been described, which may be used with any of the embodiments described herein, as would be know by those of skill in the art. Furthermore, it will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

The invention claimed is:

1. A method for exposing a target according to pattern data in a maskless lithography machine generating a plurality of exposure beamlets for exposing the target, the method comprising:
   providing input pattern data in a vector format;
   rendering and quantizing the input pattern data to generate intermediate pattern data in the form of a spatially mapped array of pixel values;
   re-sampling and re-quantizing the intermediate pattern data to generate output pattern data;
   supplying the output pattern data to the lithography machine; and
   modulating the beamlets generated by the lithography machine on the basis of the output pattern data.

2. The method of claim 1, wherein the output pattern data comprises bi-level bitmap data.

3. The method of claim 1, wherein the output pattern data consists of B/W bitmap data.

4. The method of claim 1, wherein the intermediate pattern data comprises multi-level bitmap data.

5. The method of claim 1, wherein the intermediate pattern data representing a certain portion of a pattern comprises a greater amount of data than the output pattern data representing the same portion of the pattern.

6. The method of claim 1, further comprising preprocessing vector pattern data to generate the input pattern data.

7. The method of claim 6, wherein the preprocessing comprises a proximity effect correction.

8. The method of claim 6, wherein the preprocessing comprises a resist heating correction.

9. The method of claim 1, wherein rendering the vector pattern data comprises defining an array of pixel cells, and assigning values to the pixel cells based on relative coverage of the pixel cells by features defined by the input pattern data.

10. The method of claim 1, wherein the quantizing comprises dithering by application of error diffusion on the rendered input pattern data.

11. The method of claim 10, wherein the error diffusion comprises distributing quantization error in a pixel of the rendered input pattern data to one or more adjacent pixels of the intermediate pattern data.

12. The method of claim 1, wherein the input pattern data further comprises dose map data, and the intermediate pattern data is formed on the basis of the vector format input pattern data and the dose map data.

13. The method of claim 1, wherein the re-sampling comprises defining an output grid which defines an array of output pixel cells, and assigning a value to each output pixel cell based on intermediate pattern data values falling within the output pixel cell and fractions of the output pixel cell occupied by those intermediate values.

14. The method of claim 13, wherein values in the output pixel cells are determined by calculating an average intermediate pattern data value falling within the output pixel cells.

15. The method of claims 1, wherein the re-sampling comprises transforming a pixel size of the intermediate pattern data.

16. The method of claim 15, wherein a pixel size of the intermediate pattern is larger than a pixel size of the output pattern data.

17. The method of claim 13, further comprising a pattern shift performed on the intermediate pattern data, the pattern shift comprising a shift in the output grid.

18. The method of claim 1, further comprising a pattern shift performed on the intermediate pattern data for correcting beamlet misalignment.

19. The method of claim 1, further comprising a pattern shift performed on the intermediate pattern data, the pattern shift comprising a shift of the pattern data in both a mechanical scan direction of the lithography machine and a direction perpendicular to the mechanical scan direction.

20. The method of claim 1, further comprising a pattern shift performed on the intermediate pattern data, the pattern shift comprising a shift of pattern data for an entire stripe of the pattern data.

21. The method of claim 1, further comprising a pattern scaling adjustment performed on the intermediate pattern data, the pattern scaling comprising scaling the output grid.

22. The method of claim 1, further comprising a pattern scaling adjustment performed on the intermediate pattern data for correcting for variations in beamlet scan deflection.

23. The method of 1, further comprising a pattern scaling adjustment performed on the intermediate pattern data, the pattern scaling comprising a scaling of pattern data for an entire stripe of the pattern data.

24. The method of claim 1, further comprising a dose correction performed on the intermediate pattern data.

25. The method of claim 24, wherein the dose correction is performed per beamlet.

26. The method of claim 24, wherein the dose correction is determined based on a dose factor per beamlet and a scaling factor for a stripe of the pattern data.

27. The method of claim 1, further comprising a correction performed on the intermediate pattern data for compensating for variation in the position of one or more of the beamlets.

28. The method of claim 27, wherein the wafer is moved in a mechanical scan direction during exposure of the wafer, and wherein the correction comprises an adjustment of the input pattern data that results a shift of the intermediate pattern data having a component in both the mechanical scan direction and a direction substantially perpendicular to the mechanical scan direction.

29. The method of claim 24, further comprising a correction performed on the intermediate pattern data for compensating for variation in the transmission time of the bi-level output pattern data to the lithography machine.

30. The method of claim 13, further comprising a field distortion adjustment performed on the intermediate pattern data, the distortion adjustment comprising distorting the output grid.

31. The method of claim 30, wherein the distortion is for improving overlay performance.

32. The method of claim 31, wherein the distortion is for improving matching with a different lithography tool.

33. The method of claim 30, wherein the distortion comprises at least one of a field size adjustment, a field position adjustment, a rotation of the field, an asymmetrical field size adjustment, and/or an asymmetrical rotation.

34. The method of claim 33, wherein the distortion additionally comprises higher order distortions.

35. The method of claim 1, wherein the re-quantizing comprises re-dithering by application of error diffusion on the re-sampled intermediate pattern data.

36. The method of claim 1, wherein the quantizing comprises a dithering process and the re-quantizing comprises a re-dithering process, and wherein the dithering and re-dithering are performed in opposite directions.

37. The method of claim 36, wherein the input pattern data is dithered twice to generate two sets of intermediate pattern data, each set being dithered in opposite directions.

38. The method of claim 37, wherein the two sets of intermediate pattern data are used for exposing alternating exposure lanes of the target, each set of intermediate pattern data being re-dithered in the opposite direction to the dithering before use.

39. The method of claim 36, wherein the target is moved so that each exposure lane of the target is exposed in a same direction.

40. The method of claim 35, wherein the error diffusion comprises distributing quantization error in a pixel of the re-sampled pattern data to one or more adjacent pixels of the output pattern data.

41. The method of claim 40, wherein application of error diffusion includes:
   defining an array of pixels;
   dividing the array of pixels into portions, each portion being assigned to be exposed by a different beamlet;
   determining error diffusion parameter values for each portion; and
   assigning a value to the pixels within each portion using error diffusion parameter values.

42. The method of claim 41, wherein the error diffusion parameter values comprise a threshold value and a weight value for the higher level of a bi-level output pattern data value.

43. The method of claim 42, wherein the error diffusion parameter values further comprise a weight value for the lower level of the bi-level value.

44. The method of any of claim 42, wherein the error diffusion parameter value is a threshold value, and wherein assigning a bi-level value to the pixel cells within a portion is based on comparison with the threshold value determined for the portion.

45. The method of claim 39, wherein the application of error diffusion is restricted by disallowing diffusion towards one or more pixels with a multi-level value equal to or below a further threshold value.

46. The method of claim 39, wherein the application of error diffusion is restricted by disallowing diffusion to one or more pixels that are located outside the features described in the input pattern data.

47. The method of claim 39, wherein the application of error diffusion is restricted by disallowing diffusion towards one or more pixels that have a value that differ more than a certain amount from the pixel being processed.

48. The method of claim 39, wherein each pixel has a label and wherein the application of error diffusion is restricted by disallowing diffusion towards one or more pixels that have a different label than the pixel being processed.

49. The method of claim 48, wherein the label consists of a code stored with the intermediate pattern data.

50. The method of claim 49, wherein the label is defined during preprocessing, and wherein all pixels that are covered by a feature in the vector format are assigned a first label value and all other pixels are assigned a second level value.

51. A method of operating a lithography machine wherein image data is supplied in vector format to the machine in a first step, the vector format is rendered and quantized to a bitmap data format in the form of a spatially mapped array of pixel values in a second step, said bitmap data is re-sampled in a third step for performing real-time corrections on said data, the re-sampled data is re-quantized in a fourth step, and subsequently supplied as an output bitmap to imaging hardware of the machine in a fifth step.

52. The method of claim 51, wherein the amount of data utilized for performing the first quantization step is larger than the amount of data resulting from performing said re-sampling.

53. The method of claim 51, wherein said re-sampling comprises one or more of a pattern shift, pattern scaling, or field distortion correction.

54. The method of claims 51, wherein said re-quantizing comprises performing a dose correction.

55. The method of claim 51, wherein a dithering process is performed in conjunction with the quantizing step, including a dose correction performed by adapting a dithering threshold value.

56. The method of claim 51, further comprising controlling exposure dose by modifying a pixel size of the output bitmap by transforming a pixel size of the intermediate pattern data in conjunction with said re-sampling.

57. A data path for converting input pattern data in a vector format to output pattern data in the form of a spatially mapped array of pixel values, the data path comprising:
    a first processing unit for rendering and quantizing the input pattern data to generate intermediate pattern data in the form of a spatially mapped array of pixel values;
    a first storage unit for storing the intermediate pattern data; and
    a second processing unit for re-sampling and re-quantizing the intermediate pattern data to generate output pattern data.

58. The data path of claim 57, wherein the first processing unit comprises software and/or hardware for dithering the rendered input pattern data.

59. The data path of claim 57, wherein the second processing unit comprises software and/or hardware for re-dithering the re-sampled pattern data.

60. The data path of claims 57, wherein the capacity of the first storage unit is sufficient to store the intermediate pattern data for an entire field of the pattern data.

61. The data path of claims 57, further comprising a second storage unit for storing the output pattern data.

62. A system for exposing a target according to pattern data, comprising:
    a maskless lithography machine generating a plurality of exposure beamlets for exposing the target and modulating the beamlets on the basis of output pattern data;
    a data path according to claim 57 for receiving input pattern data and generating the output pattern data; and
    a pattern streaming system for supplying the output pattern data to the lithography machine.

* * * * *